United States Patent [19]

Murakami et al.

[11] Patent Number: 5,040,034

[45] Date of Patent: Aug. 13, 1991

[54] SEMICONDUCTOR DEVICE

[75] Inventors: Yoshinori Murakami; Teruyoshi Mihara, both of Yokosuka; Tsutomu Matsushita, Yokohama; Kenji Yao; Norihiko Kiritani, both of Yokosuka, all of Japan

[73] Assignee: Nissan Motor Co., Ltd., Yokohama, Japan

[21] Appl. No.: 465,748

[22] Filed: Jan. 18, 1990

[30] Foreign Application Priority Data

Jan. 18, 1989 [JP] Japan ........................ 1-7765
Mar. 13, 1989 [JP] Japan ........................ 1-57985

[51] Int. Cl.$^5$ .................. H01L 29/78; H01L 29/48; H01L 29/56; H01L 29/64
[52] U.S. Cl. .................. 357/23.4; 357/15; 357/56; 357/59; 357/68
[58] Field of Search .................. 357/23.4, 15, 56, 59, 357/68

[56] References Cited

U.S. PATENT DOCUMENTS 4,737,831 4/1988 Iwai .................. 357/23.4

FOREIGN PATENT DOCUMENTS 0159663 4/1985 European Pat. Off. .......... 357/23.4
58-061673 4/1983 Japan .................. 357/23.4
62-0115775 5/1987 Japan .................. 357/23.4
62-274775 11/1987 Japan .................. 357/23.4
2103419 8/1981 United Kingdom .............. 357/23.4

OTHER PUBLICATIONS

Lane et al., "Epitaxial WMOS Power Transistors", Feb. 1980, p. 349–355 of IEEE Transaction on Electron Devices, vol. ED-27, No. 2, 357 * 23.7.
Lisiak et al., "Optimization of Nonplanar Power MOS Transistor", pp. 1229–1234, IEEE Trans. on Elec. Dev. vol. ED 25≠610 Oct. 1978, 357 * 23.7.

Primary Examiner—Andrew J. James
Assistant Examiner—Daniel Kim
Attorney, Agent, or Firm—Foley & Lardner

[57] ABSTRACT

A semiconductor device includes a semiconductor substrate as a drain region. A metal source region is located on a first surface of the substrate. The metal and the substrate constitute a Schottky junction. An insulated gate, including a gate electrode and an insulating film surrounding the gate electrode, is adjacent to the Schottky junction, such that angle formed by the Schottky junction and the insulated gate in the substrate is an acute angle. A part of the Schottky metal can be buried in the form of a pillar in the substrate, and a channel region of the Schottky junction can be formed on the pillar near the insulated gate.

6 Claims, 30 Drawing Sheets $V_G = 0$
$V_D = 0$ $V_G = 0$
$V_D > 0$ $V_G > 0$
$V_D > 0$ $V_G = 0$
$V_D < 0$ GATE ELECTRODE | GATE OXIDE FILM | n-SILICON | SCHOTTKY METAL

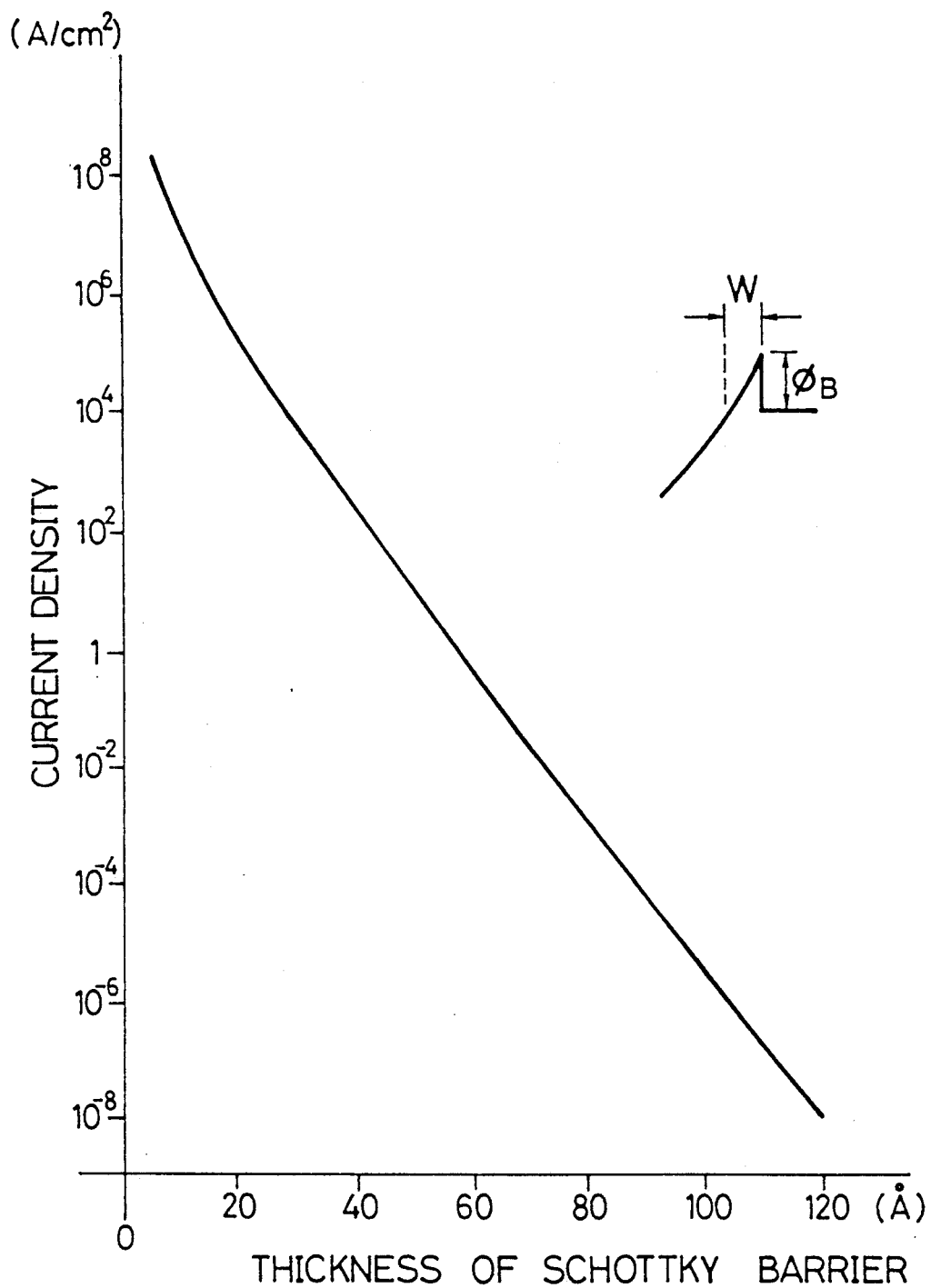

ANGLE OF SILICON ∠A-O-B

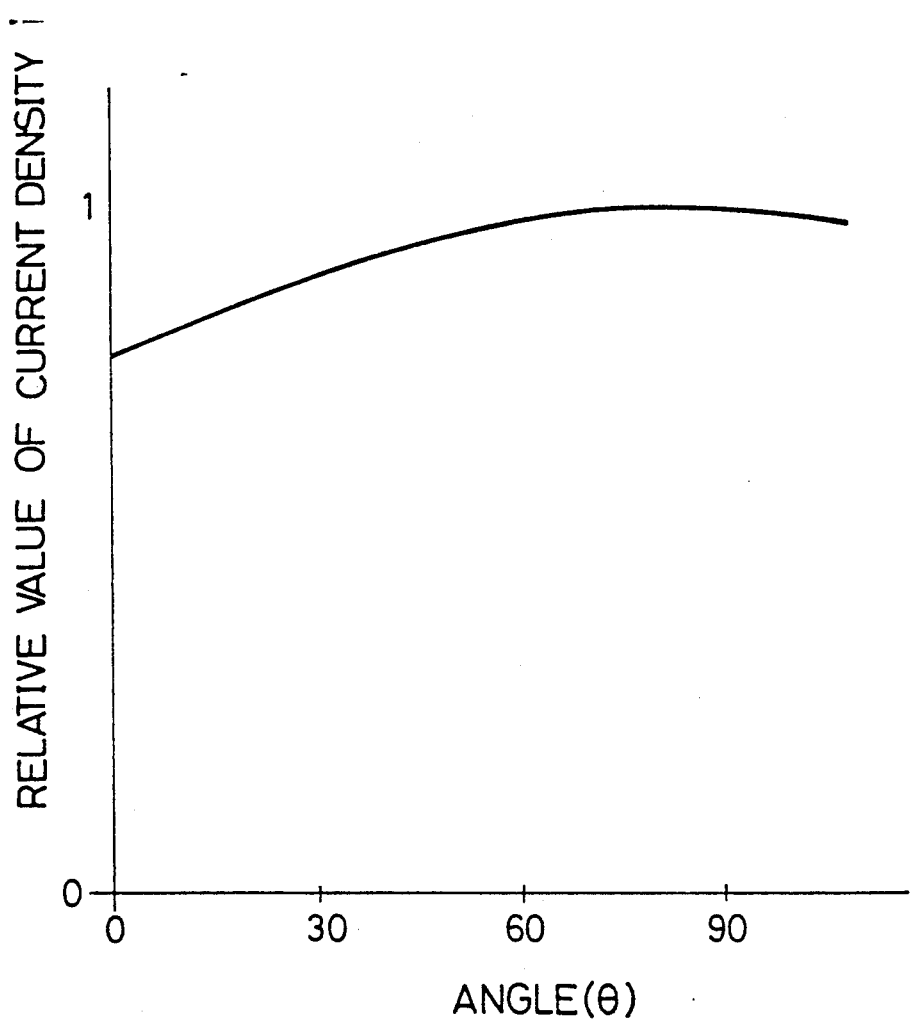

SEMICONDUCTOR DEVICE

BACKGROUND OF THE INVENTION

1. Field of the Invention

The present invention relates to a semiconductor device in which a thickness of an energy barrier of a Schottky junction is modulated by an electric field of an insulated gate electrode to control a tunnel phenomenon, thereby controlling a main current.

2. Description of the Background Art

In FIGS. 1 to 6, there is shown a conventional semiconductor device such as a Schottky tunnel transistor, in which a thickness of an energy barrier of a Schottky junction is modulated by an electric field of an insulated gate electrode to control a tunnel phenomenon, thereby controlling a main current, as disclosed in Japanese Patent Laid-Open Specification No. 62-274775.

As shown in FIG. 1, an n+-type drain region 2 is formed in the surface area of an n−-type silicon semiconductor substrate 1, and apart from the drain region 2 a Schottky metal 4 for acting as a source region is also embedded in the surface area of the substrate 1 so as to form a Schottky junction between the substrate 1 and the Schottky metal 4. A gate electrode 8 is formed on the surface of the substrate 1 via a gate insulating film 5 formed thereon between the drain region 2 and the Schottky metal source region 4. In this case, the barrier thickness of the Schottky junction 3 formed between the substrate 1 and the Schottky metal source region 4 in the direction perpendicular to the surface of the substrate 1 is modulated by the electric field of the gate electrode 6 to control the tunnel current, as hereinafter described in detail. An insulating film 7 is formed on the gate electrode 6 and the surface of the substrate 1 so as to cover these members, and source and drain electrodes 8 and 9 are attached to the source and drain regions 4 and 2, respectively, and are separated from the gate electrode 6.

In FIGS. 2a to 2d, there is shown a method for producing a Schottky tunnel transistor shown in FIG. 1.

In FIG. 2a, an ion implantation of an n-type impurity is effected in the surface area of an n−-type silicon semiconductor substrate 1 using a photoresist mask (not shown), and then a heat diffusion of the implanted impurity is carried out to form an n+-type drain region 2 in the surface area of the substrate 1. As shown in FIG. 2b, a hollow 10 is formed in the surface area of the substrate 1 by a photo etching. In FIG. 2c, the hollow 10 of the substrate 1 is filled up with a Schottky metal 4 such as tungsten by a selective growth. Then, a silicon oxide ($SiO_2$) film as a gate insulating film is formed over the surface of the substrate 1, and a conductive polycrystalline silicon film is formed on the silicon oxide film. The obtained laminate layer composed of the silicon oxide and the polycrystalline silicon films is patterned by the photo etching to obtain a gate electrode 6 on the surface of the substrate 1 between the drain region 2 and the Schottky metal source region 4 so that the barrier thickness of the Schottky junction 3 formed between the substrate 1 and the Schottky metal source region 4 in the direction perpendicular to the surface of the substrate 1 may be modulated to control a tunnel current by the electric field of the gate electrode 6. In FIG. 2d, an insulating film 7 is formed on the gate electrode 6 and the surface of the substrate 1 so as to cover these members 6 and 1, and then contact holes 7a for providing drain and source electrodes on the drain and source regions 2 and 4 are opened in the insulating film 7 by the photo etching. Then, source and drain electrodes 8 and 9 are formed on the drain and source regions 2 and 4 in the contact holes 7a of the insulating film 7 using vapor deposition and patterning, thereby obtaining a Schottky tunnel transistor shown in FIG. 1.

In FIGS. 3a to 3d, there are shown energy band structures of a surface portion of the semiconductor substrate 1 near the gate insulating film 5 of the semiconductor device shown in FIG. 1.

As shown in FIG. 3a, when both gate voltage $V_G$ and drain voltage $V_D$ are zero, the thickness of the Schottky barrier is thick, and thus there is no electron flow between the drain and the source. In FIG. 3b, when $V_G$=zero and $V_D$>zero, a reverse bias voltage is applied to the Schottky junction 3, and no electron flows between the drain and the source in a similar manner to that shown in FIG. 3a. In FIG. 3c, when $V_G$>zero and $V_D$>zero, a certain positive voltage is applied to the gate electrode 6, and the thickness of the Schottky barrier is modulated by the electric field of the gate electrode 6 and is reduced to a thickness value W. Hence, electrons flow from the Schottky metal 4 to the semiconductor substrate 1 through the Schottky junction 3 therebetween by the tunnel effect, and thus a tunnel current flows from the drain region 2 to the Schottky metal source region 4 through the Schottky junction 3. In FIG. 3d, when $V_G$=zero and $V_D$<zero, a forward bias voltage is applied to the Schottky junction 3. As a result, a lot of electrons can move from the semiconductor substrate 1 to the Schottky metal 4, and the electric current flows therebetween in the forward-direction.

As described above, the condition where the tunnel current can flow through the Schottky barrier is as follows. That is, the thickness W of the Schottky barrier in FIG. 3c, i.e., the distance between the junction (vertical line) in the energy band illustration and the crossing between the Fermi level and the lower end line of the conductive zone inclined by the electric field of the semiconductor substrate 1, is approximately 100 Å. In the semiconductor device shown in FIG. 1, the electric field of the gate electrode 6 gives such an affection to the Schottky junction 3 in a range of at most 1000 Å in depth from the surface of the substrate 1.

In the process for forming the hollow 10 in the silicon semiconductor substrate 1, when the isotropic etching is effected using a photoresist etching mask 11, the cross section of the side wall of the hollow 10 is as shown in FIG. 4a, and when the anisotropic dry etching is effected, the cross section of the side wall of the hollow 10 is as shown in FIG. 4b. In these cases, the Schottky junction 3 contacts with the semiconductor substrate 1 at an angle of approximately 90° with respect to the surface of the substrate 1 in the range of approximately 1000 Å in depth.

FIG. 5a is an enlarged schematic view illustrating the electric field spreading from the gate electrode 6 to the Schottky junction 3 via the gate insulating film 5 in the connection portion between the gate insulating film 5 and the Schottky junction 3 of the Schottky tunnel transistor which is prepared via the hollow etching step shown in FIG. 4a or 4b. In FIG. 5a, O is a contact point between the end of the Schottky junction 3 and the lower surface end of the gate insulating film 5, and A is a point on the Schottky junction 3 at a distance r away from the point O. The distance r represents the range of the Schottky junction 3 being affected by the electric field of the gate electrode 6. B is a point on the interface between the silicon semiconductor substrate 1 and the gate insulating film 5 at the distance r away from the point O, and C is a point where the vertical line standing from the point B intersects the upper surface of the gate insulating film 5.

Now, when a depletion layer is formed in the vicinity of the Schottky junction 3, as shown in FIG. 3c, electric line force extends from the gate electrode 6 to the Schottky junction 3 along the line CBA, as shown in FIG. 5a, i.e., along the arcuate line BA around the point O in the silicon semiconductor substrate 1. In fact, this electric line force is affected by a relatively weak electric field of the n+-type drain region 2, which, however, can be ignored for explaining the principle of the Schottky tunnel transistor.

Assuming that the length of the arc BA is $L = \pi \cdot r/2$, the energy band structure along the line CBA in FIG. 5a is shown in FIG. 5b, wherein $\phi B$ is a height of the Schottky barrier and dox is a thickness of the gate insulating film 5. In the silicon semiconductor substrate 1, since the depletion layer is formed in the vicinity of the Schottky junction 3, the following equation is obtained from Poisson's equation, $$d\psi/dX = -q \cdot N_D/\xi Si \quad (1)$$

wherein $\psi$ is a potential, X arc coordinates on a segment AB whose direction extending from the point A to the point B is defined as positive, q is an electric charge, $\xi Si$ is a dielectric constant of the silicon semiconductor substrate 1, and $N_D$ is a donor density of the n-type silicon semiconductor substrate 1.

In FIGS. 5a and 5b, the following equation is obtained at the point B from the law of constant electric flux, $$\epsilon OX \cdot Eox = \epsilon Si \cdot ESi \quad (2)$$

wherein $\epsilon ox$ is a dielectric constant of the gate insulating film 5, Eox is electric field in the gate insulating film 5, and ESi is electric field in the silicon semiconductor substrate. Then, assuming that the electric field at the point B is Vs, the following equation is obtained:

$$Eox = (V_G - V_S)/dox \quad (3)$$

From the above described equations (1) (2) (3), the thickness W of the Schottky barrier can be obtained when a tunnel current flows. When the gate voltage $V_G$, the thickness dox of the gate insulating film 5 and the donor density $N_D$ are constant, the thickness W of the Schottky barrier can be expressed as a function of the length L of the arc BA. When the length L is small near the point O, the voltage is large, and the thickness W becomes small. Hence, a tunnel current having a large current density flows. On the other hand, when the length L is large away from the point O, the thickness W is large, and the current density of the tunnel current is rapidly reduced.

As described above, the thickness W of the Schottky barrier is approximately 100 Å when the tunnel current starts to flow through the Schottky junction. Therefore, now, when the thickness W of the Schottky barrier is 100 Å at the constant values of $V_D$ and $V_G$, the length of the line BA is defined to L, and the section OA of the Schottky junction 3 is a channel equivalent region which is referred to as a "channel" region of the Schottky tunnel transistor.

In FIG. 6, there is shown a characteristic curve representing a relation between a thickness W of the Schottky barrier and a tunnel current density when the height $\phi B$ of the Schottky barrier is 0.6 eV. From FIG. 6, it is readily understood that as the thickness W of the Schottky barrier is reduced, the current density of the tunnel current is rapidly increased.

In a conventional Schottky tunnel transistor, the angle formed by the Schottky junction 3 constituting the channel region and the electrode surface (lower surface) of the gate electrode 6 or the lower surface of the gate insulating film 5 having a uniform thickness, i.e., the angle AOB defining the corner of the silicon semiconductor substrate 1 between the Schottky junction 3 and the gate insulating film 5 in FIG. 5a is approximately 90°, and thus the channel region can not be sufficiently large. Hence, a large current capacity can not be obtained.

SUMMARY OF THE INVENTION

Accordingly, it is an object of the present invention to provide a semiconductor device, free from the aforementioned defects and disadvantages of the prior art, which is capable of increasing a tunnel current flowing portion of a Schottky junction to enlarge a channel region to obtain a large current capacity.

In accordance with one aspect of the present invention, there is provided a semiconductor device, comprising a semiconductor substrate as a drain region having a first surface, a metal as a source region being formed on the first surface of the substrate, the metal and the substrate constituting Schottky junction, and an insulated gate which includes a gate electrode and insulating film surrounding the gate electrode being adjacent to the Schottky junction, an angle formed by the Schottky junction and the insulated gate in the substrate being an acute angle.

In accordance with another aspect of the present invention there is provided a semiconductor device, comprising a first conductivity type semiconductor substrate as a drain region having a first surface, a metal as a source region being formed on the first surface of the substrate, the metal and the substrate constituting Schottky junction, a part of the metal being buried in the substrate in the form of pillars, and an insulated gate which includes a gate electrode and insulating film surrounding the gate electrode being adjacent to the buried metal pillar, a channel region being a part of the Schottky junction where a tunnel current flows by effect of the insulated gate, the channel region being formed at least in a depth direction of the substrate.

BRIEF DESCRIPTION OF THE DRAWINGS

FIG. 6 is a graphical representation of a characteristic curve illustrating a relation between a thickness of the Schottky barrier and a tunnel current density of the Schottky tunnel transistor shown in FIG. 1;

FIGS. 16a and 16b are longitudinal cross sections showing a method for producing the semiconductor device shown in FIG. 15a;

FIGS. 18a to 18c are longitudinal cross sections showing a method for producing the semiconductor device shown in FIG. 17a;

FIGS. 20a to 20c are longitudinal cross sections showing a method for producing the semiconductor device shown in FIG. 19a;

FIGS. 23a and 23b show a surface pattern of the semiconductor device shown in FIG. 21 and a characteristic curve representing a relation between a current capacity and an angle formed by striped gates and striped resist patterns of the same;

DESCRIPTION OF THE PREFERRED EMBODIMENTS

Figure 7:
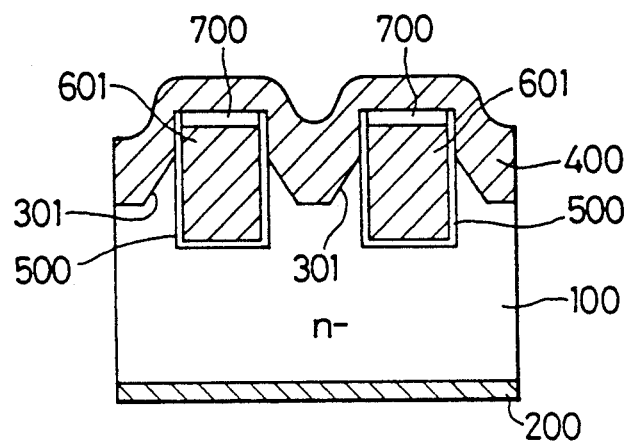
FIG. 7 is a longitudinal cross section of a first embodiment of a semiconductor device according to the present invention.

Referring now to the drawings, wherein like reference characters designate like or corresponding parts throughout the several views and thus the repeated description thereof may not be repeated for brevity, there is shown in FIGS. 7 and 8 the first embodiment of a semiconductor device such as a Schottky tunnel transistor according to the present invention.

As shown in FIG. 7, in a Schottky tunnel transistor, a drain electrode 200 is formed on the back surface of an $n^-$-type silicon semiconductor substrate 100, and a Schottky metal film 400 functioning as a source region is formed on the front surface area of the substrate 100 so as to cover the front surface of the substrate 100. The Schottky metal film 400 and the substrate 100 constitute Schottky junctions 301 at the interface therebetween. As to the Schottky metal film 400, for example, tungsten (W) or the like can be used. A plurality of gate electrodes 601 is buried in parallel in the substrate 100, that is, each gate electrode 801 is buried in the substrate 100 via a gate insulating film 500 having a U-shaped cross section and formed therebetween at the side and bottom walls, and an insulating film 700 is formed between the top of each gate electrode 601 and the Schottky metal film 400 for electrically separating these two members. In FIG. 7, channel equivalent regions or "channel" regions of the Schottky junctions 301 are shown by slant lines and are controlled by the gate electrodes 601. In this embodiment, the angle formed by the channel region of the Schottky junction 301 and the electrode surface of the gate electrode 601 or the gate insulating film 500 in the substrate 100 is an acute angle such as 35.26°.

In this case, as shown in FIG. 7, a plurality of gate electrodes 601 having the same form is provided in parallel, and a plurality of channel regions is also provided in parallel between the gate electrodes 600 and the Schottky metal film 400 acting as the common source region. Accordingly, the Schottky tunnel transistor described above is a vertical structure type suitable for obtaining a large current capacity.

A process for producing the Schottky tunnel transistor described above will now be described in detail in connection with FIGS. 8a to 8d.

Figure 8A:
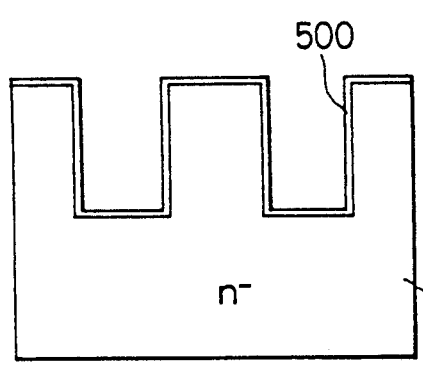
FIGS. 8a to 8d are longitudinal cross sections showing a method for producing the semiconductor device shown in FIG. 7.

In FIG. 8a, vertical grooves or holes for forming gate electrodes are formed in the front surface area of the n⁻-type silicon semiconductor substrate 100 having a face orientation (100) by anisotropic dry etching, and then a silicon oxide (SiO₂) film for forming gate insulating films 500 is formed on the surface including the inner surfaces of the vertical grooves of the substrate 100.

Figure 8B:
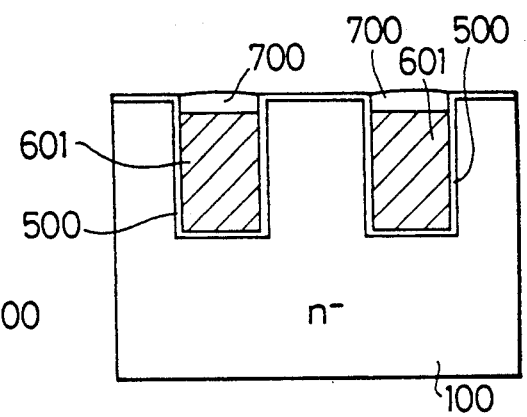

In FIG. 8b, conductive polycrystalline silicon is deposited on the surface of the substrate 100 so as to fill up the vertical grooves, and then etching of the surface of the substrate 100 is effected to uniformly remove the polycrystalline silicon on only the substrate 100 so as to leave the polycrystalline silicon within the vertical grooves, thereby forming the gate electrodes 601 in the vertical grooves. Then, the heat oxidation of the obtained gate electrodes 601 is effected to form insulating films 700 composed of the silicon oxide (SiO₂) film in the top portions for insulating the gate electrodes 601 from the upper side.

Figure 8C:
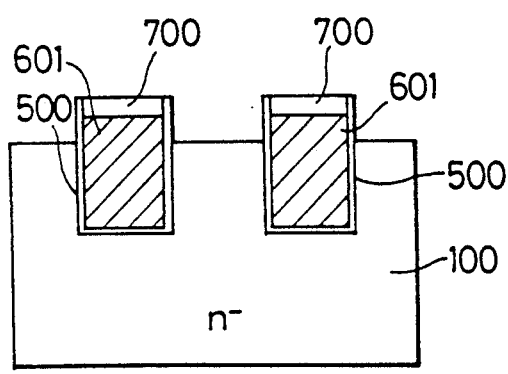
Figure 8D:
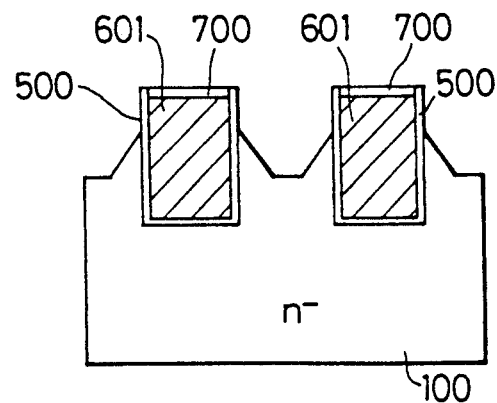

In FIG. 8c, the silicon oxide film on the surface of the substrate 100 is removed, and then the upper portion of the substrate 100 is also etched so that Schottky junctions may be affected by the electric field of the gate electrodes 601. In FIG. 8d, the upper portion of the substrate 100 is further etched by the anisotropic etching using an alkaline solution to expose the surface (111) of the substrate 100 and to obtain slant surfaces.

Then, a Schottky metal film 400 composed of tungsten or the like is formed on the surface of the substrate 100 for forming the Schottky junctions 301 between the substrate 100 and the Schottky metal film 400, and a drain electrode 200 is formed on the back surface of the substrate 100, thereby obtaining the Schottky tunnel transistor shown in FIG. 7.

In this embodiment, the angle of the substrate 100 between the channel region of the Schottky junction 301 and the electrode surface of the gate electrode 601 or the gate insulating film 500 is 35,26°.

Figure 9:
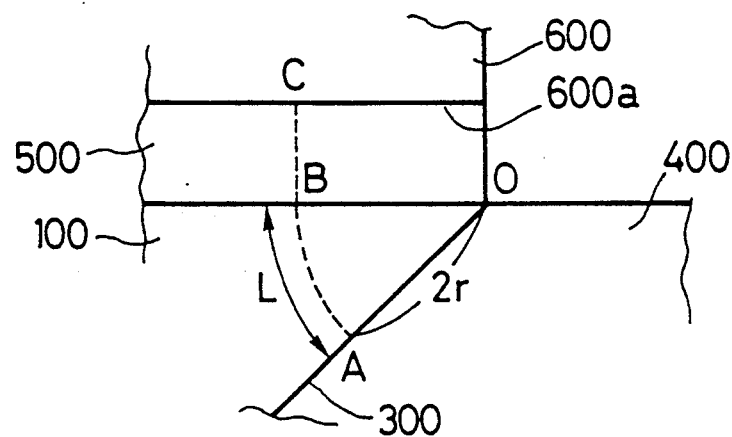
FIG. 9 is an enlarged schematic cross section showing an electric field spreading from the gate electrode to the Schottky junction of the semiconductor device according to the present invention.
Figure 10:
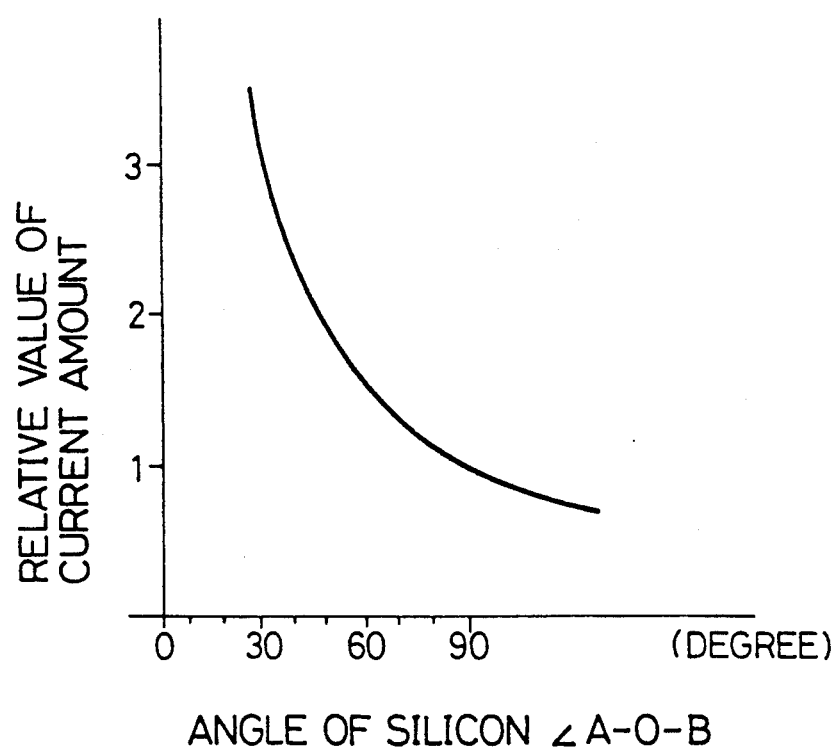
FIG. 10 is a graphical representation of a characteristic curve illustrating a relation between an angle of a silicon semiconductor substrate between a Schottky junction and a gate insulating film of the semiconductor device according to the present invention.

FIG. 9 illustrates electric field extending from a gate electrode 600 to a Schottky junction 300 formed at the interface between the silicon semiconductor substrate 100 and the Schottky metal 400 through the gate insulating film 500. Now, the gate electrode 600 formed on the gate insulating film 500, the gate electrode 600 including the gate insulating film 500, is hereinafter referred to as an insulating gate electrode. FIG. 10 shows a characteristic curve representing a relation between an angle AOB of the silicon semiconductor substrate 100 between the Schottky junction 300 and the insulated gate electrode 600 or the gate insulating film 500 and a total tunnel current amount flowing through the Schottky junction 300 in FIG. 9.

According to the present invention, by making the angle AOB of the silicon semiconductor substrate 100 between the Schottky junction 300 affected by the gate electrode 600 and the insulating gate electrode to be an acute angle, the channel region, i.e., the part of the Schottky junction 300, which is affected by the gate electrode 600 and through which the tunnel current flows, becomes large, and the transconductance is improved to realize the large current capacity.

Figure 1:
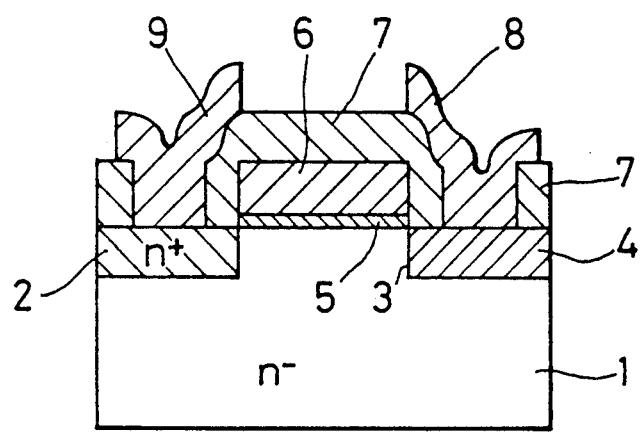
FIG. 1 is a longitudinal cross section of a conventional Schottky tunnel transistor.
Figure 2A:
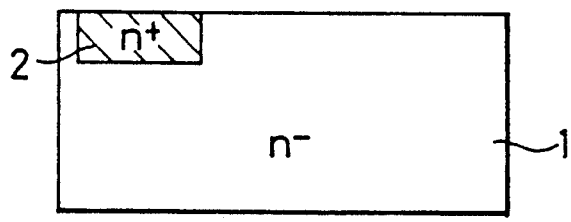
FIGS. 2a to 2d are longitudinal cross sections showing a method for producing the Schottky tunnel transistor shown in FIG. 1.
Figure 2B:
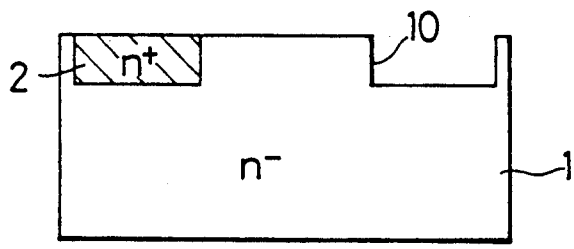
Figure 2C:
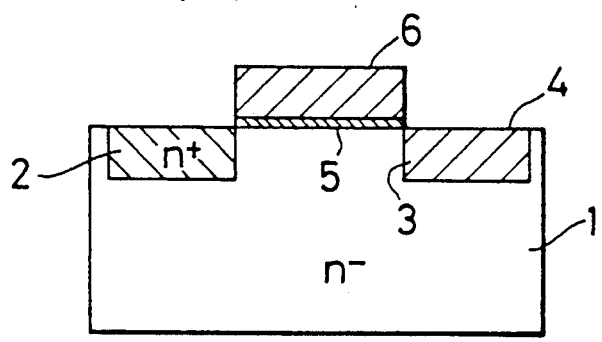
Figure 2D:
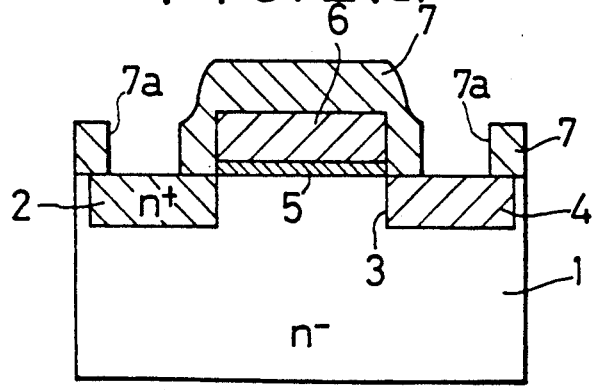
Figure 3A:
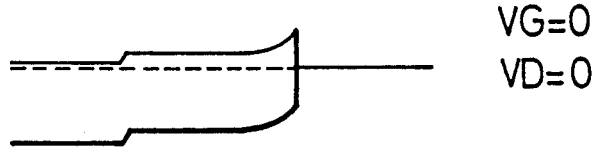
FIGS. 3a to 3d are schematic views of energy band structures of the Schottky tunnel transistor shown in FIG. 1.
Figure 3B:
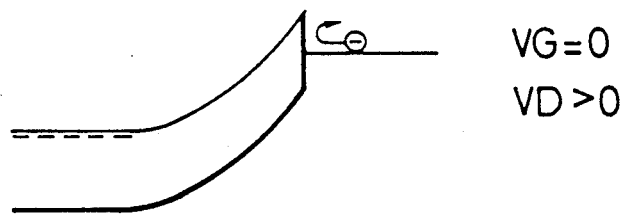
Figure 3C:
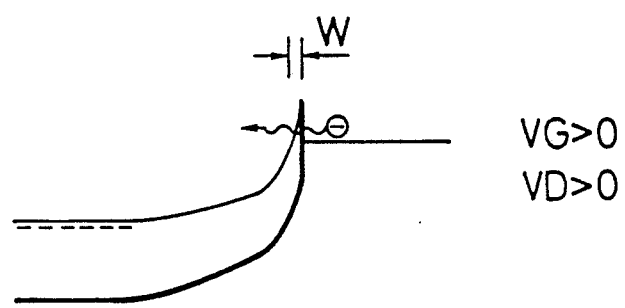
Figure 3D:
Figure 4A:
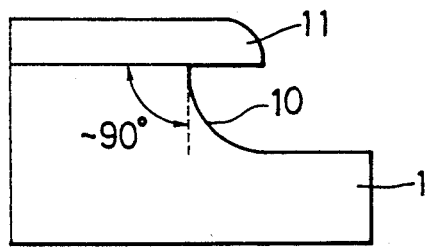
FIGS. 4a and 4b are enlarged longitudinal schematic cross sections of hollows etched in a conventional manner.
Figure 4B:
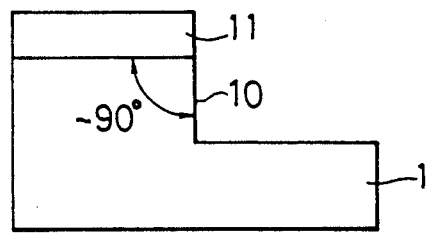
Figure 5A:
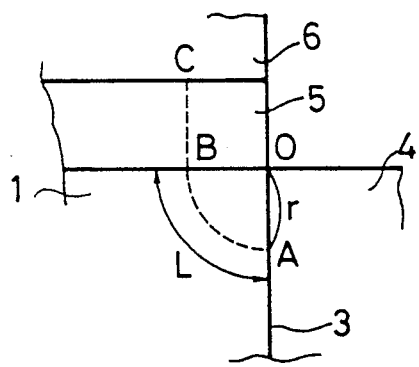
FIGS. 5a and 5b are enlarged schematic views showing an electric field of the gate electrode of the Schottky tunnel transistor shown in FIG. 1.
Figure 5B:
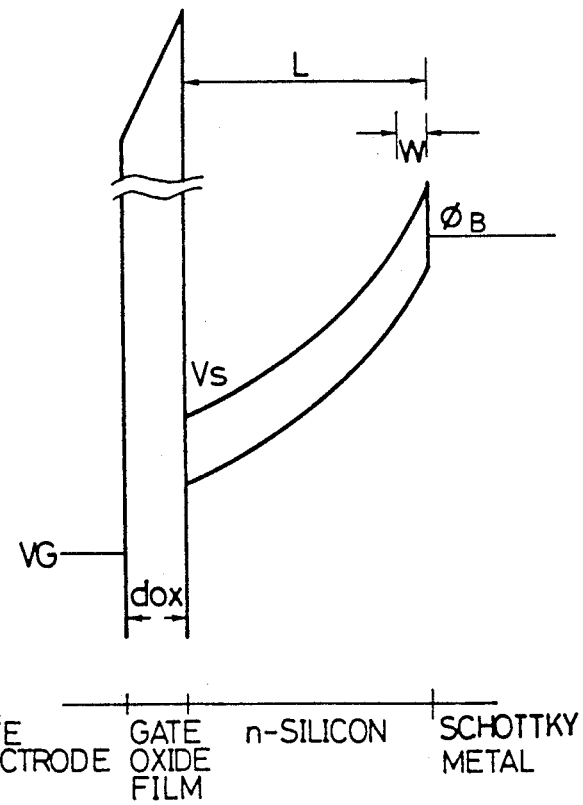

For instance, when the angle AOB is an acute angle of 45°, the electric line force extends from the gate electrode 600 to the Schottky junction 300 through the gate insulating film 500 and the substrate 100 along the broken line CBA, as shown in FIG. 9. When the length of the arc BA is L, the distance AO is double as long as that of the conventional one having the angle AOB of 90°, as shown in FIG. 5a. Hence, when the gate voltage, the impurity density of the substrate and the condition of the gate insulating film are the same as those of the conventional one, the channel region becomes double as long as that of the conventional one, and the total tunnel current amount flowing through the channel region becomes double as much as that of the conventional one. Hence, as the angle AOB is reduced, the current flowing through the channel region is increased. As shown in FIG. 10, when the angle AOB is reduced less than 60°, the total tunnel current amount is rapidly increased.

In the first embodiment shown in FIGS. 7 and 8, the angle AOB is 35.26°, as described above, and the total tunnel current amount is approximately 2.5 times as much as that of the conventional one having the angle AOB of approximately 90°, with the result of realizing the large current capacity, as shown in FIG. 10.

Figure 11:
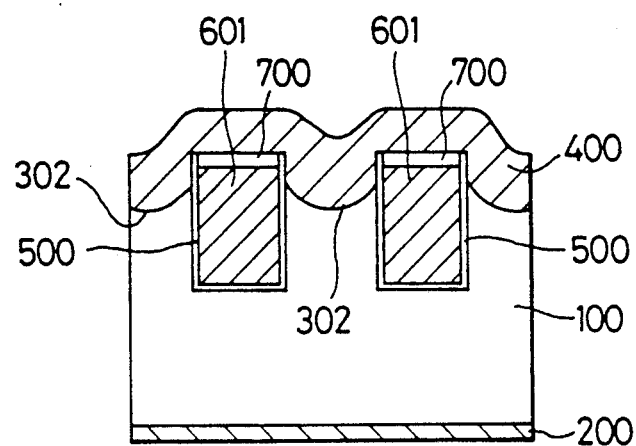
FIG. 11 is a longitudinal cross section of a second embodiment of a semiconductor device according to the present invention.

In FIGS. 11 and 12, there is shown the second embodiment of the Schottky tunnel transistor according to the present invention, having the same construction as that of the first embodiment shown in FIGS. 7 and 8, except that Schottky junctions 302 are provided in an arcuate surface form to make the angle of the silicon semiconductor substrate 100 between the gate insulating film 500 and the channel region of the Schottky junction 302 affected by the gate electrode 601 to be an acute angle.

Figure 12A:
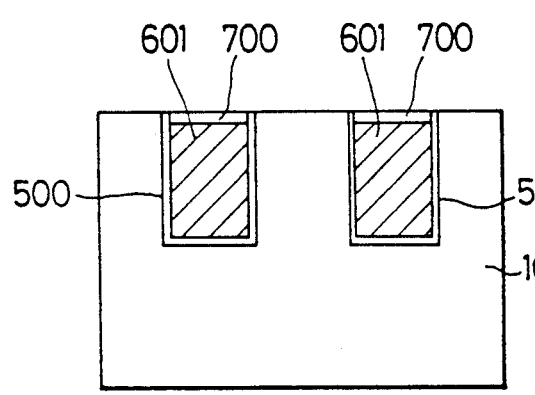
FIGS. 12a and 12b are longitudinal cross sections showing a method for producing the semiconductor device shown in FIG. 11.

In this embodiment, the Schottky tunnel transistor is produced in the similar manner to the first embodiment described above, as shown in FIGS. 12a and 12b. In FIG. 12a, gate insulating films 500, gate electrodes 601 and insulating films 700 are formed in an n⁻-type silicon semiconductor substrate 100, in the same manner as those in the first embodiment.

Figure 12B:
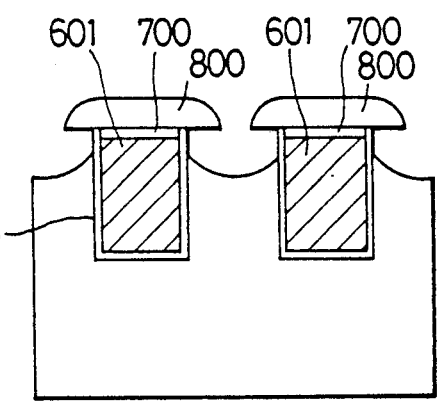

In FIG. 12b, a photoresist mask 800 having small holes among the gate electrodes 601 is formed on the surface of the substrate 100, and the isotropic etching of the surface of the substrate 100 is effected to form hollows having an arcuate lower surface among the gate electrodes 601 surrounded by the gate insulating films 500.

Then, the photoresist mask 800 is removed from the insulating films 700, and a Schottky metal film 400 is formed on the surface of the substrate 100 to form Schottky junctions 302 between the substrate 100 and the Schottky metal film 400, and a drain electrode 200 is formed on the back surface of the substrate 100, thereby obtaining the Schottky tunnel transistor shown in FIG. 11.

In this embodiment, the angle of the silicon semiconductor substrate 100 between the gate insulating film 500 and the channel region of the Schottky junction 302 is determined by the isotropic etching using the photoresist mask having the small holes, as described above, and can be formed to be an acute angle of less than 30° with the result of the same effects and advantages as those obtained in the first embodiment. Accordingly, the large current capacity can be obtained in the same manner as the first embodiment as compared with the conventional one having the angle of 90°.

Figure 13:
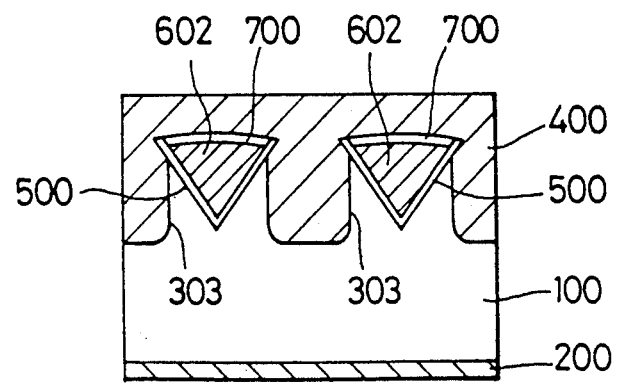
FIG. 13 is a longitudinal cross section of a third embodiment of a semiconductor device according to the present invention.

In FIGS. 13 and 14, there is shown the third embodiment of the Schottky tunnel transistor according to the present invention, having the same structure as that of the first embodiment shown in FIGS. 7 and 8, except that Schottky junctions 303 are formed in approximately vertical planes, and electrode surfaces of gate electrodes 602 and gate insulating films 500 are inclined so that the angle of the silicon semiconductor substrate 100 between the gate insulating film 500 and the channel region of the Schottky junction 303 affected by the gate electrode 602 may be an acute angle.

Figure 14A:
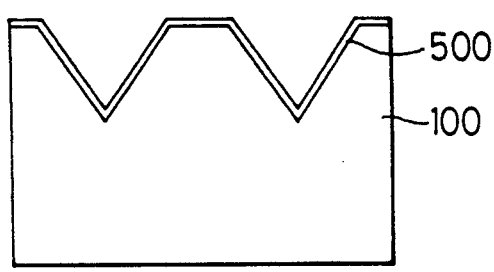
FIGS. 14a to 14d are longitudinal cross sections showing a method for producing the semiconductor device shown in FIG. 13.

In this embodiment, the Schottky tunnel transistor is produced in the similar manner to the first and second embodiments described above, as shown in FIGS. 14a to 14d. In FIG. 14a, the anisotropic etching of the surface of an $n^-$-type silicon semiconductor substrate 100 having a face orientation (100) is effected by using an alkaline solution to obtain hollows having a V-shaped cross section in the surface area of the substrate 100, and then a silicon oxide ($SiO_2$) film is formed on the surface including the inner surfaces of the V-shaped grooves of the substrate 100 to form gate insulating films 500.

Figure 14B:
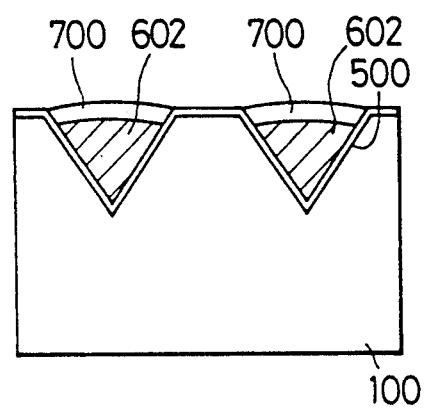

In FIG. 14b, gate electrodes 602 and insulating films 700 are formed on the surface of the substrate 100 in the same manner as the first embodiment described above.

Figure 14C:
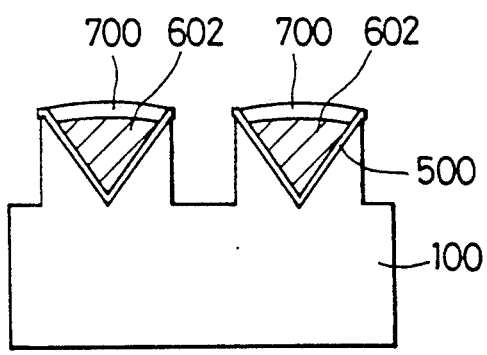
Figure 14D:
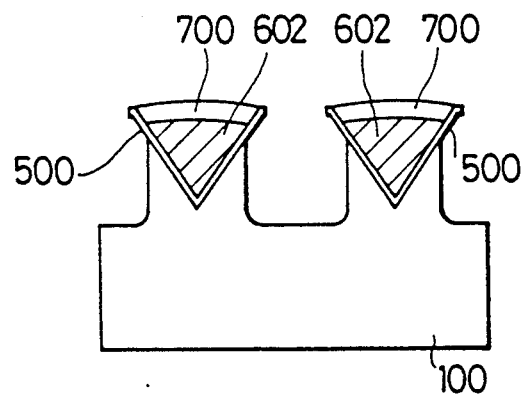

In FIG. 14c, the part of the silicon oxide film is removed, and then vertical grooves or holes are formed among the gate electrode portions by the anisotropic dry etching in the same manner as described above. In FIG. 14d, the vertical holes are further scooped out to somewhat enlarge them by isotropic etching so that the upper portions of the gate electrodes 602 may project inside of the holes and the Schottky junction 303 can receive the electric field of the gate electrodes 602.

Then, a Schottky metal film 400 is formed on the surface of the substrate 100 to form Schottky junctions 303 between the substrate 100 and the Schottky metal film 400, and a drain electrode 200 is formed on the back surface of the substrate 100, thereby obtaining the Schottky tunnel transistor shown in FIG. 13. In this embodiment, the same effects and advantages as those of the first and second embodiments can be, of course, obtained.

Figure 15A:
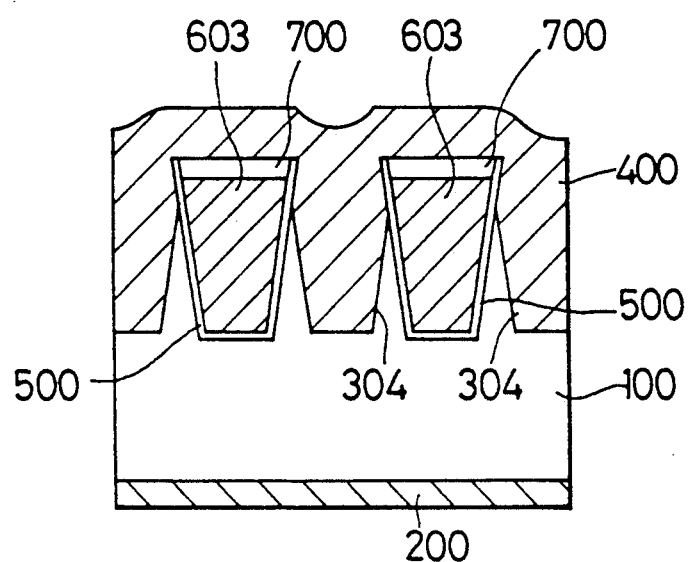
FIGS. 15a and 15b are longitudinal cross sections of a fourth embodiment of a semiconductor device according to the present invention.
Figure 15B:
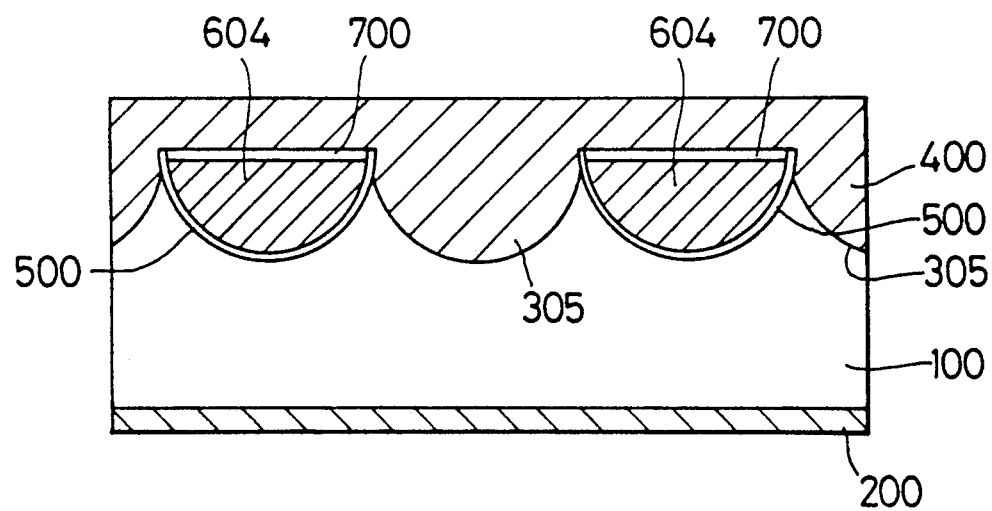

In FIGS. 15 and 16, there is shown the fourth embodiment of the Schottky tunnel transistor according to the present invention, having the same structure as that of the first embodiment shown in FIGS. 7 and 8, except that both Schottky junctions 304 and gate electrodes 603 along with gate insulating films 500 are formed in inclined surface forms in opposite sides with reference to the vertical plane, as shown in FIG. 15a, or both Schottky junctions 305 and gate electrodes 604 along with gate insulating films 500 are formed in semicylindrical (or semispherical) surface forms projecting downwards in parallel with each other, as shown in FIG. 15b, so that the angle of the silicon semiconductor substrate 100 between the gate insulating film 500 and the channel region of the Schottky junction 303 affected by the gate electrode 602 may be an acute angle to increase a total tunnel current flowing through the channel region.

Figure 16A:
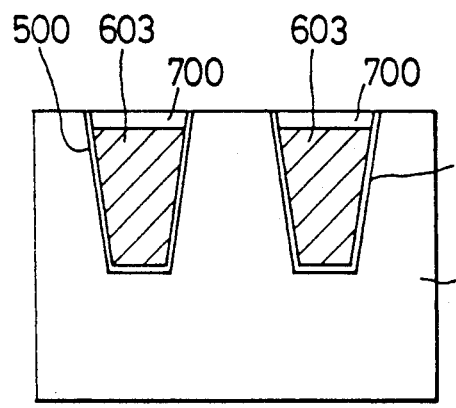

In this embodiment, for example, the Schottky tunnel transistor shown in FIG. 15a is produced in the similar manner to the embodiments described above, as shown in FIGS. 16a and 16b. In FIG. 16a, vertical grooves or holes including side walls having an angle of more than 70° with respect to the horizontal plane are formed in parallel in the surface portion of an $n^-$-type silicon semiconductor substrate 100 by using a trench etching technique. Then, gate insulating films 500, gate electrodes 603 and insulating films 700 are formed, and the silicon oxide film on the surface of the substrate 100 is removed in the same manner as described above.

Figure 16B:
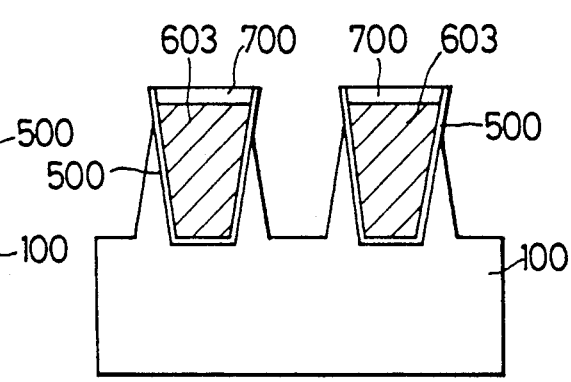

In FIG. 16b, vertical grooves or holes for a Schottky metal film are formed in the surface portion of the substrate 100 by the trench etching in the same manner as described above so that the upper portions of the gate electrodes 603 together with the gate insulating films 500 may project inside of the holes and the Schottky junction 304 can receive the electric field of the gate electrodes 603.

Then, a Schottky metal film 400 is formed on the surface of the substrate 100 to form the Schottky junctions 304 between the substrate 100 and the Schottky metal film 400, and a drain electrode 200 is formed on the back surface of the substrate 100, thereby obtaining the Schottky tunnel transistor shown in FIG. 15a. In this embodiment, the same effects and advantages as those of the embodiments described above can be, of course, obtained.

In the above described producing method for the Schottky tunnel transistor shown in FIG. 15a, the Schottky tunnel transistor shown in FIG. 15b can be produced in the same manner, except that the isotropic etching using the photoresist mask having small openings in the second embodiment described above, as shown in FIG. 12b, is used instead of the trench etching to form semicylindrical (or semispherical) hollows.

Figure 17A:
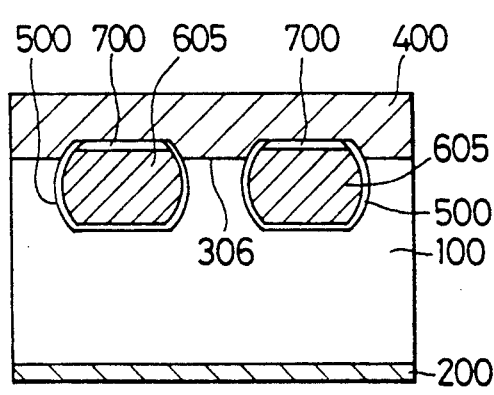
FIGS. 17a and 17b are longitudinal cross sections of a fifth embodiment of a semiconductor device according to the present invention.
Figure 17B:
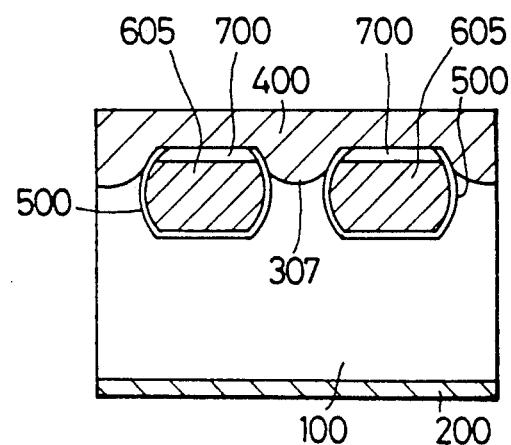

In FIGS. 17 and 18, there is shown the fifth embodiment of the Schottky tunnel transistor according to the present invention, having the same structure as that of the embodiments described above, except that electrode surfaces or side walls of gate electrodes 605 along with gate insulating films 500 are formed in an arcuate surface form projecting outwards and Schottky junctions 306 or 307 are formed in a horizontal plane or in an arcuate surface form projecting downwards, as shown in FIG. 17a or 17b, so that the angle of the silicon semiconductor substrate 100 between the gate insulating film 500 and the channel region of the Schottky junction 306 or 307 affected by the gate electrode 605 may be an acute angle to increase a total tunnel current flowing through the channel region.

Figure 18A:
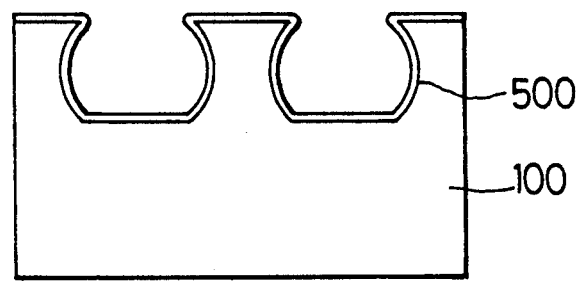

In this embodiment, for example, the Schottky tunnel transistor shown in FIG. 17a is produced in the similar manner to the embodiments described above, as shown in FIGS. 18a to 18c. In FIG. 18a, grooves or holes having a swelled sphere-like side wall for gate electrodes are formed in parallel in the surface portion of an $n^-$-type silicon semiconductor substrate 100 by using the anisotropic etching while conditions of an etching gas and the like are adjusted for suitably forming the swelled sphere-like holes. Then, a silicon oxide film for forming gate insulating films 500 is formed in the same manner as described above.

Figure 18B:
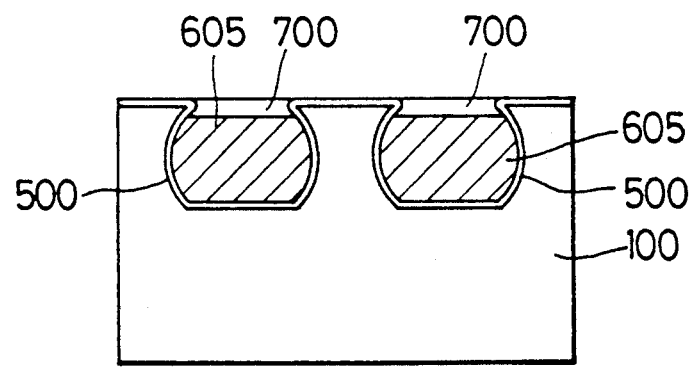

In FIG. 18b, gate electrodes 605 and insulating films 700 are formed in the same manner as described above.

Figure 18C:
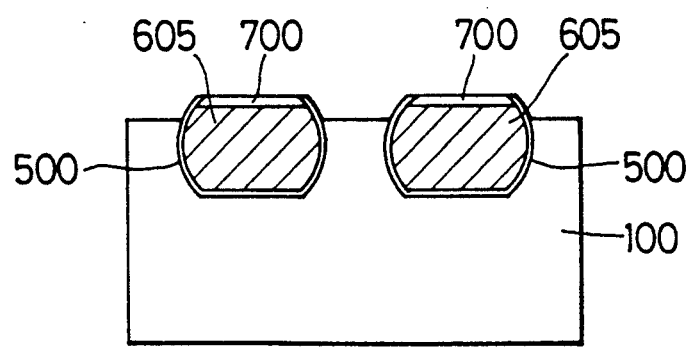

In FIG. 18c, a part of the silicon oxide film on the surface of the substrate 100 is etched, and the surface portion of the substrate 100 is uniformly etched so that the Schottky junction may be affected by the electric field of the gate electrodes 605.

Then, a Schottky metal film 400 is formed on the surface of the substrate 100 to form the Schottky junctions 306 between the substrate 100 and the Schottky metal film 400, and a drain electrode 200 is formed on the back surface of the substrate 100, thereby obtaining the Schottky tunnel transistor shown in FIG. 17a. In this embodiment, the same effects and advantages as those of the embodiments described above can be, of course, obtained.

In the above described producing method for the Schottky tunnel transistor shown in FIG. 17a, the Schottky tunnel transistor shown in FIG. 17b can be produced in the same manner, except that the isotropic etching using the photoresist mask having small openings in the second embodiment described above, as shown in FIG. 12b, is used instead of the etching of the flat surface to form hollows having an arcuate lower surface form projecting downwards, with the result of obtaining a more acute angle of the silicon semiconductor substrate 100 between the gate insulating film 500 and the channel region of the Schottky junction 307 affected by the gate electrode 605.

Figure 19A:
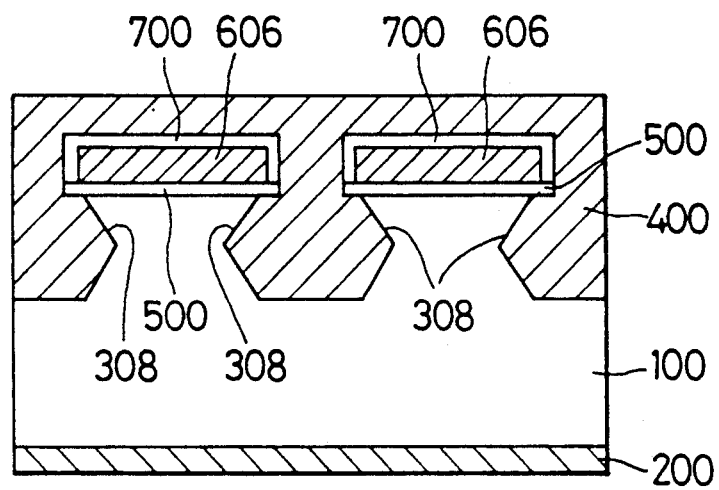
FIGS. 19a and 19b are longitudinal cross sections of a sixth embodiment of a semiconductor device according to the present invention.
Figure 19B:
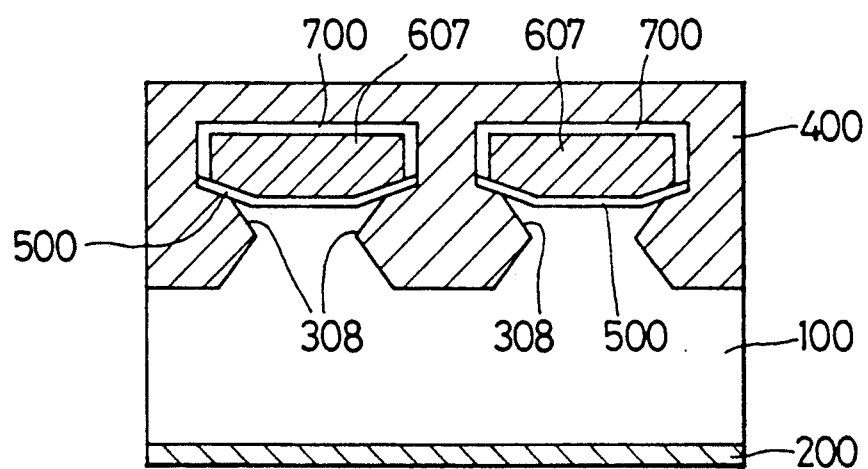

In FIGS. 19 and 20, there is shown the sixth embodiment of the Schottky tunnel transistor according to the present invention, having the same structure as that of the embodiments described above, except that Schottky junctions 308 are formed in a slat surface form and electrode surfaces or bottom surfaces of gate electrodes 606 along with gate insulating films 500 formed thereon are formed in approximately horizontal surface form or a somewhat inclined surface form with respect to the horizontal plane, as shown in FIG. 19a or 19b, so that the angle of the silicon semiconductor substrate 100 between the gate insulating film 500 and the channel region of the Schottky junction 308 affected by the gate electrode 606 may be an acute angle to increase a total tunnel current flowing through the channel region.

Figure 20A:
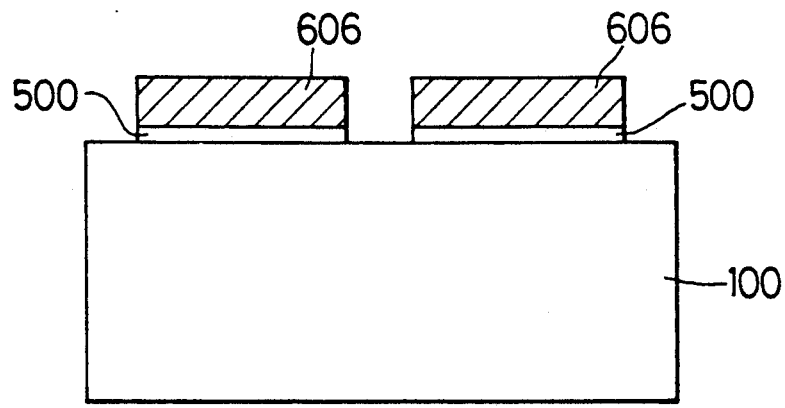

In this embodiment, for example, the Schottky tunnel transistor shown in FIG. 19a is produced in the similar manner to the embodiments described above, as shown in FIGS. 20a to 20c. In FIG. 20a, a silicon oxide film for forming gate insulating films 500 and a conductive polycrystalline silicon film for forming gate electrodes 606 are consecutively formed on the surface of an $n^-$-type silicon semiconductor substrate 100 having a face orientation (100), and then the gate electrodes 606 are formed on the surface of the substrate 100 through the silicon oxide film interposed therebetween by using the photo etching technique.

Figure 20B:
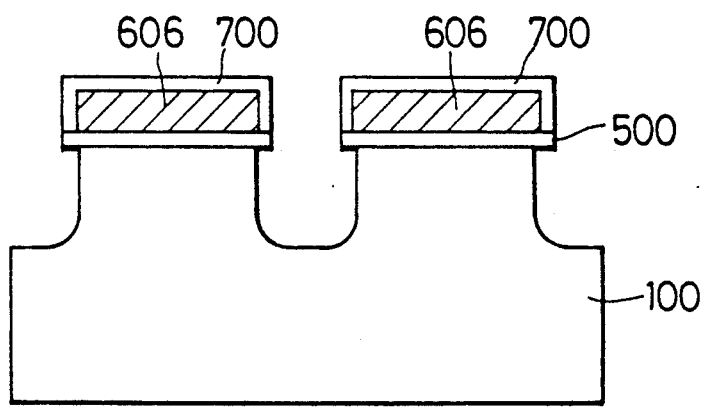

In FIG. 20b, insulating films 700 are formed on the top and side surfaces of the gate electrodes 606 for isolating the gate electrodes 606 from the outside in the same manner as described above, and then the silicon oxide film on the surface of the substrate 100 except the silicon oxide film as the gate insulating films 500 between the gate electrodes 606 and the substrate 100 is removed in the same manner as described above. Then, the anisotropic etching of the surface of the substrate 100 is effected to form grooves or holes having approximately vertical side walls among the gate electrodes 606, and then the holes are somewhat scooped up by the isotropic etching.

Figure 20C:
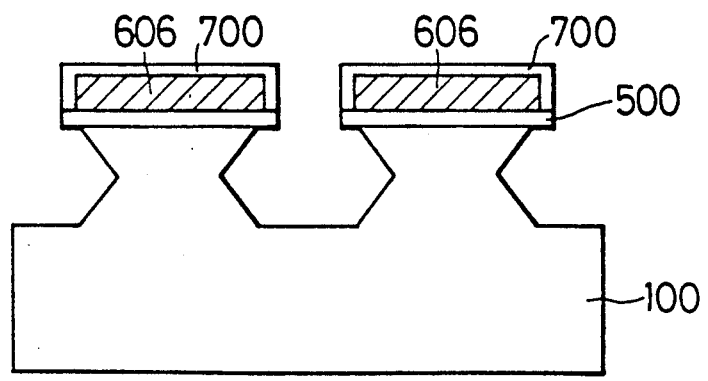

In FIG. 20c, the obtained holes of the substrate 100 are further etched by the anisotropic etching using an alkaline solution to expose the surface (111) of the substrate 100 to obtain slant surfaces.

Then, a Schottky metal film 400 is formed on the surface of the substrate 100 to form the Schottky junctions 308 between the substrate 100 and the Schottky metal film 400, and a drain electrode 200 is formed on the back surface of the substrate 100, thereby obtaining the Schottky tunnel transistor shown in FIG. 19a.

In this embodiment, the angle of the substrate 100 between the channel region of the Schottky junction 308 and the gate insulating film 500 is 54.74°, and a total tunnel current amount is approximately 1.64 times as much as that of the conventional one having the angle of approximately 90°. In this case, the same effects and advantages as those of the above described embodiments can be obtained.

In the above described producing method for the Schottky tunnel transistor shown in FIG. 19a, the Schottky tunnel transistor shown in FIG. 19b can be produced in the same manner, except that somewhat slat surface portions are formed at the gate electrode forming portions of the surface of the substrate 100 by etching before the silicon oxide film for forming the gate insulating films 500 and the conductive polycrystalline silicon film for forming the gate electrodes 606 are consecutively formed on the surface of substrate 100. In this case, a more acute angle of the silicon semiconductor substrate 100 between the gate insulating film 500 and the channel region of the Schottky junction 308 affected by the gate electrode 606 is obtained, and thus the larger current capacity can be realized.

In the above described embodiments for producing the Schottky tunnel transistor, when the Schottky metal is filled up in a complicated groove or hollow, a selective growing method of a metal film by the CVD method, the electrolytic plating method or the like can be advantageously used with good results.

In FIGS. 21 and 22, there is shown the seventh embodiment of the Schottky tunnel transistor according to the present invention, having a similar structure to that of the first embodiment shown in FIGS. 7 and 8. In this embodiment, as shown in FIGS. 21a to 21d, a drain electrode 200 is formed on the back surface of an $n^-$-type silicon semiconductor substrate 100, and a Schottky metal film 400 functioning as a common source region is formed on the front surface area of the substrate 100 so as to cover the front surface of the substrate 100. The Schottky metal film 400 and the substrate 100 constitute Schottky junctions 300 at the interface therebetween.

A plurality of gate electrodes 600 is buried in parallel in the substrate 100, that is, each gate electrode 600 is buried in the substrate 100 via a gate insulating film 500 having a U-shaped cross section and formed therebetween, at the side and bottom walls, and an insulating film 700 is formed between the top of each gate electrode 600 and the Schottky metal film 400 for electrically separating the two members.

Figure 21A:
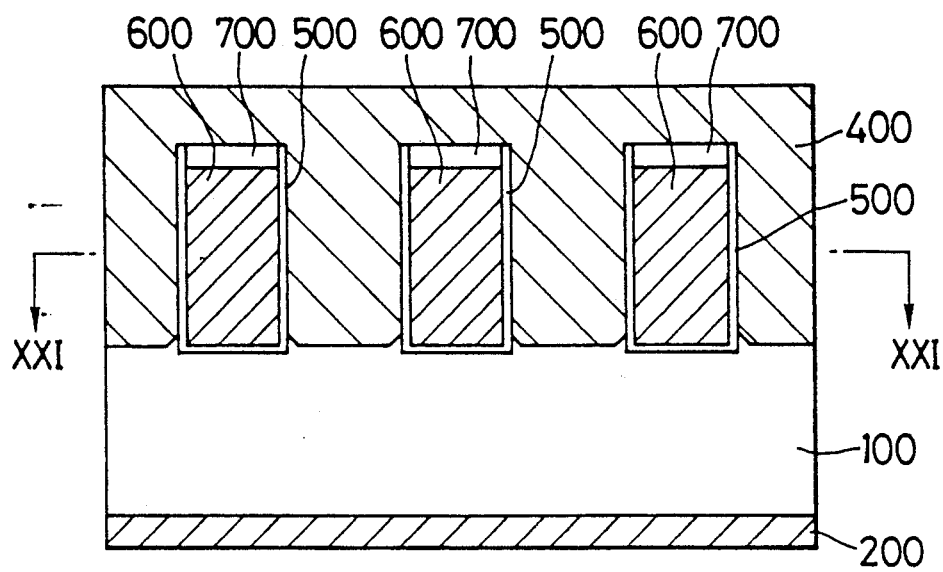
FIGS. 21a to 21d show a seventh embodiment of a semiconductor device according to the present invention, FIG. 21a being a longitudinal cross section, FIG. 21b being a transverse cross section, taken along the line XXI to XXI in FIG. 21a, FIGS. 21c being a perspective view, partially in section, FIG. 21d being a schematic view for illustrating positions of electrodes.
Figure 21B:
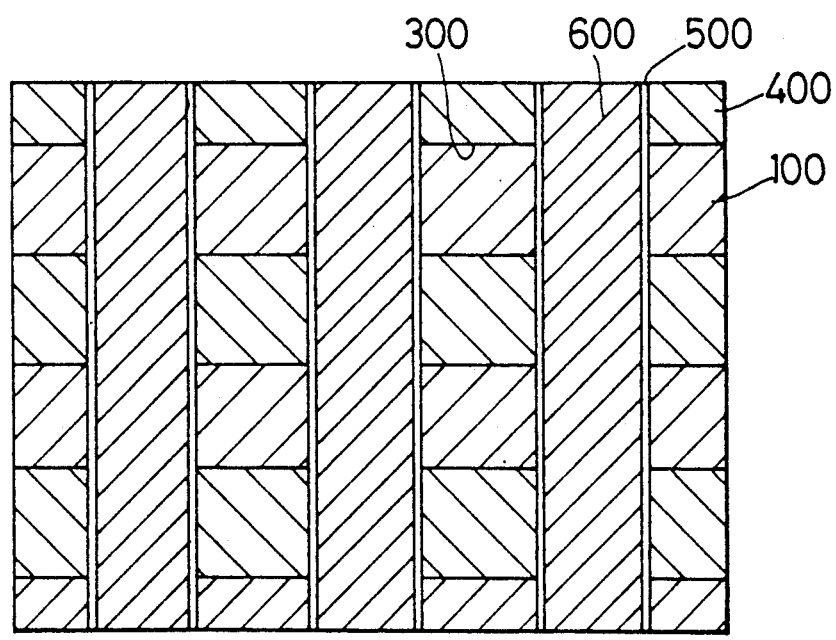
Figure 21C:
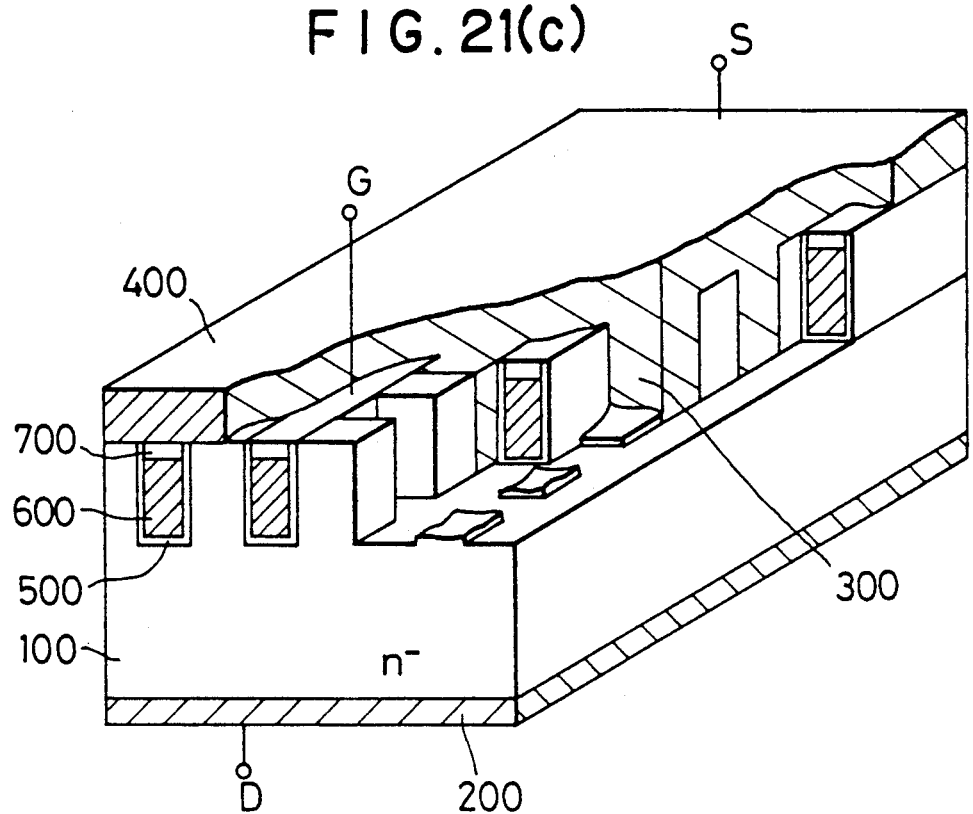

In this embodiment, a plurality of Schottky metal pillars having a rectangular solid form is buried in the substrate 100, and each Schottky metal pillar contacts with the substrate 100 and the gate insulating films 500 surrounding the gate electrodes 600 at their side surfaces extending in the vertical direction of the same height as that of the gate electrodes 600 and also contacts the substrate 100 at its horizontal interfaces having approximately the same height as the bottom of the gate electrodes 600, as shown in FIGS. 21a to 21c. In this case, the Schottky junctions 300 are formed between the Schottky metal film 400 and the substrate 100, and the four side walls of each Schottky metal pillar become the channel regions of the Schottky junction 300, with the result of obtaining the large current capacity. That is, in this embodiment, the Schottky metal electrode of a plurality of pillar forms is buried in the semiconductor substrate to form the Schottky junctions therebetween, and the insulated gates are arranged in the vicinity of the Schottky metal pillars to form the channel regions in the direction in depth, resulting in that the channel density is increased, and the semiconductor device having a high current capacity is realized.

In this case, the same effects and advantages as those of the above described embodiments can be obtained.

Figure 21D:
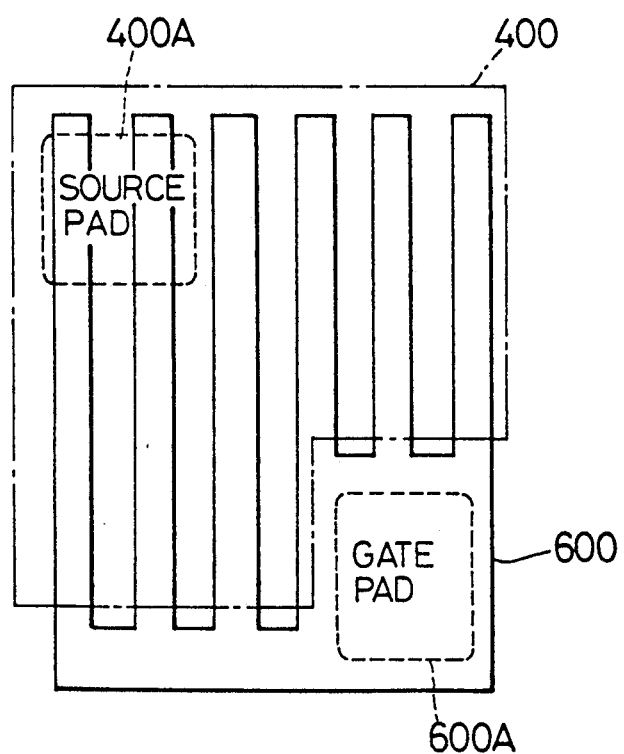
Figure 22A:
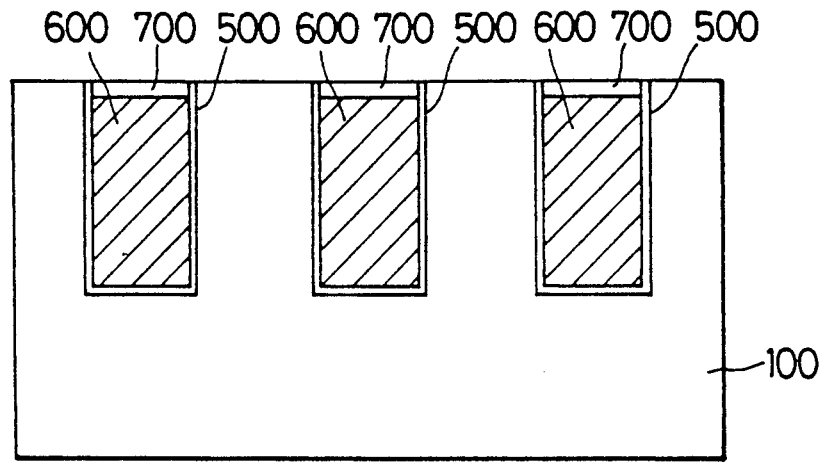
FIGS. 22a to 22c are cross sectional views showing a method for producing the semiconductor device shown in FIG. 21.
Figure 22B:
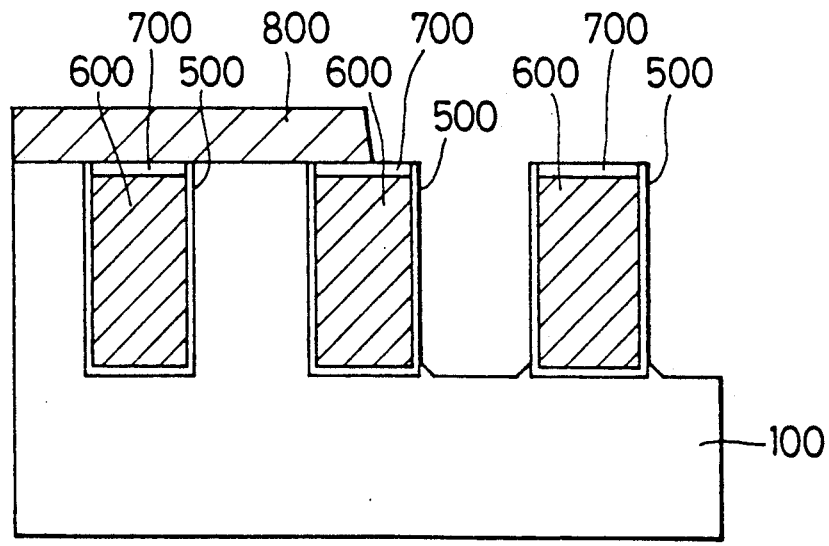
Figure 22C:
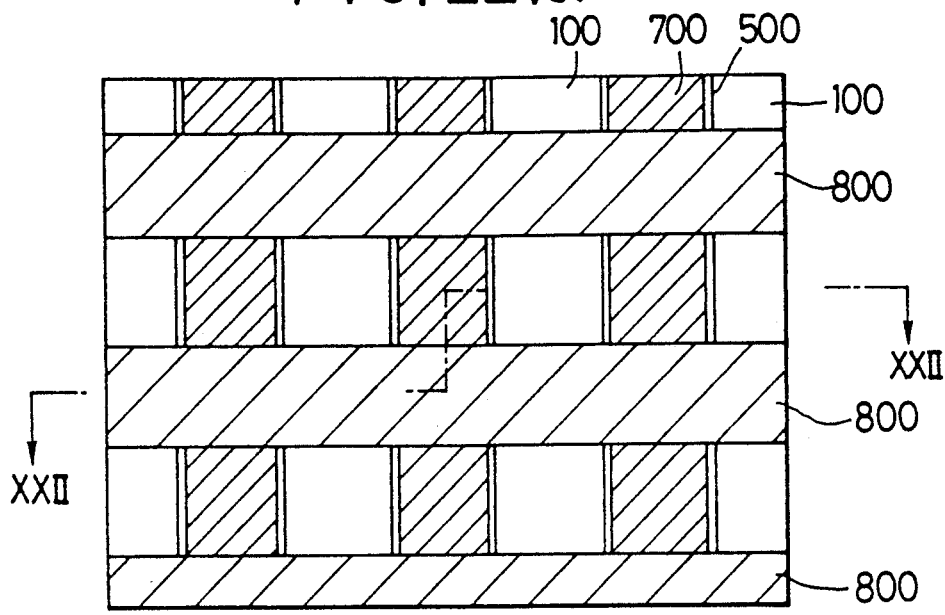

In this embodiment, the Schottky tunnel transistor shown in FIG. 21 is produced in the similar manner to the above described embodiments, as shown in FIGS. 22a to 22c. In FIG. 22a, a photoresist pattern (not shown) of stripes is formed on the surface of an $n^-$-type silicon semiconductor substrate 100, and the stripes of vertical grooves or holes are formed in the surface area of the substrate 100 by using the anisotropic dry etching. In this case, the obtained holes preferably possess approximately vertical side walls. Then, gate insulating film 500, gate electrodes 600 and insulating films 700 are formed in the stripes of holes to obtain vertical insulated gates.

In FIGS. 22b and 22c, by using a photoresist pattern 800 of stripes crossing the stripes of the vertical insulated gates, the surface area of the substrate 100 is etched in approximately the same depth as that of the vertical insulated gates to form grooves or holes having a rectangular cross section between the vertical insulated gates by the anisotropic etching. In this case, the crossing angle of the stripes of the photoresist pattern 800 and the stripes of the vertical insulated gates having the gate electrodes 600 does not give much influence to the current capacity of the device, but is preferably a right angle or so.

Then, the photoresist pattern 800 is removed, and a Schottky metal film 400 is formed on the surface of the substrate 100 to form the Schottky junctions 300 between the substrate 100 and the Schottky metal film 400. Then, a drain electrode 200 is formed on the back surface of the substrate 100, thereby obtaining the Schottky tunnel transistor shown in FIGS. 21a to 21c. A source pad 400A and a gate pad 600A connecting to the Schottky metal source region 400 and the gate electrodes 600, respectively, are attached to the surface of the Schottky tunnel transistor, as shown in FIG. 21d.

Figure 23A:
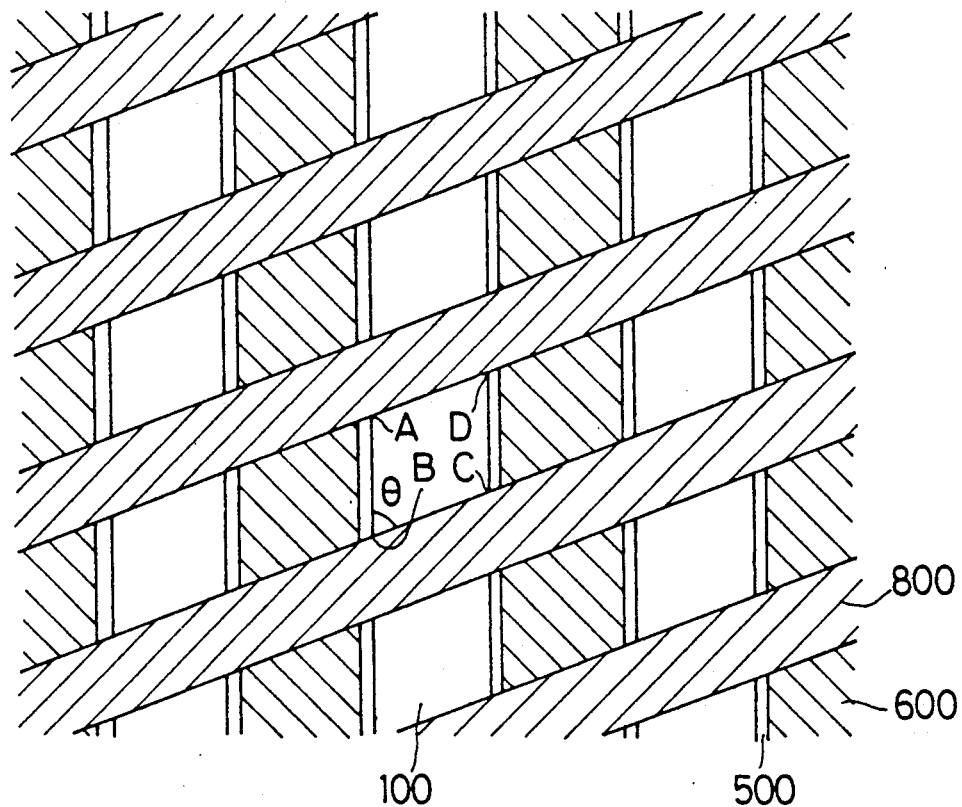

Now, the relation between the current capacity and the angle between the stripes of the gates including the gate electrodes 600 and the stripes of the photoresist pattern 800 of the structure shown in FIG. 21 will be described. FIG. 23a illustrates a crossing pattern of the stripes of the gates and the stripes of the photoresist pattern 800, which intersect each other at a certain angle to define parallelogrammic Schottky metal pillars having a parallelogrammic cross section, and the four side walls of each parallelogrammic Schottky metal pillar are surrounded by the substrate 100 and the gate insulating films 500. In one parallelogrammic Schottky metal pillar ABCD angle ABC is $\theta$. The relation between angle $\theta$ and the current capacity J to be picked up is represented by the following equation:

$$J = [(1/\theta) + \{1/(\pi - \theta)\}] \cdot \sin \theta \qquad (4)$$

This relation is shown in FIG. 23b. The angle $\theta$ does not give much influence to the current capacity of the device, but is preferably an angle as close as possible to a right angle.

Figure 24A:
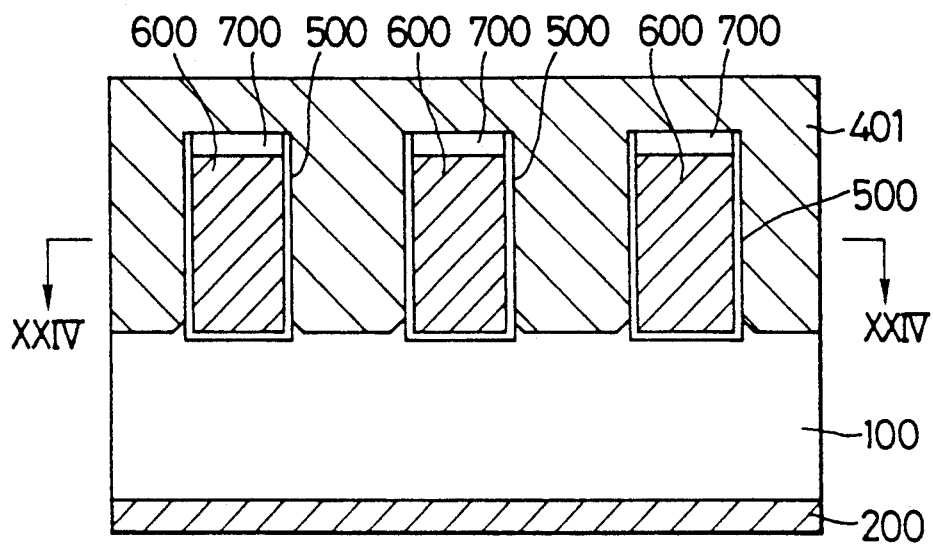
FIGS. 24a to 24c, like FIGS. 21a to 21c, show an eighth embodiment of a semiconductor device according to the present invention.
Figure 24B:
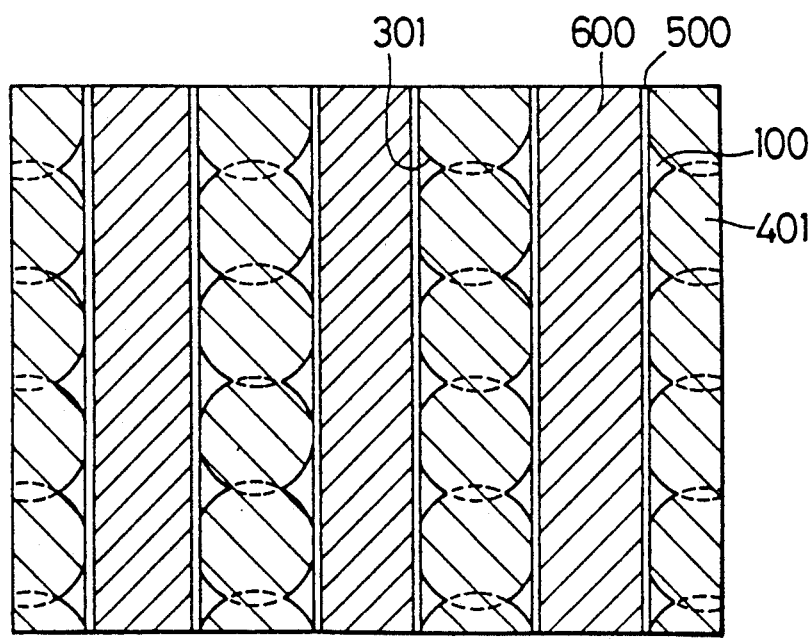
Figure 24C:
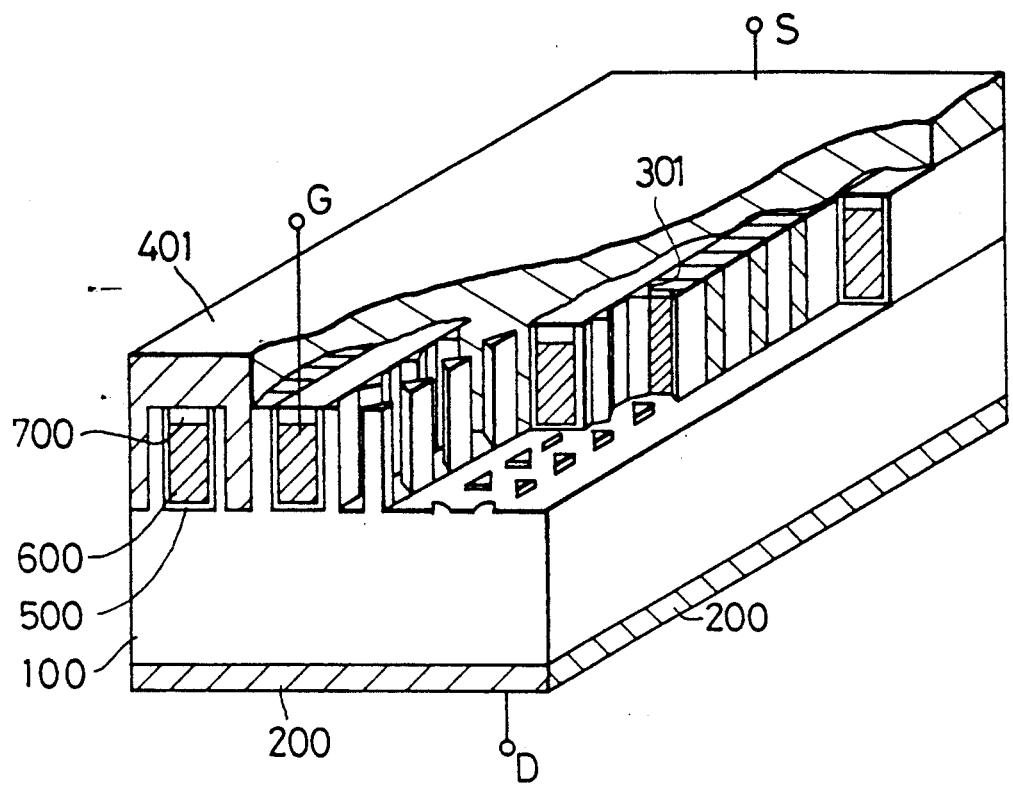

In FIGS. 24 and 25, there is shown the eighth embodiment of the Schottky tunnel transistor according to the present invention, having the same construction as that of the seventh embodiment shown in FIGS. 21 and 22, except that a plurality of Schottky metal pillars having a circular cylinder form is buried in the substrate 100 between the insulated gates, and the Schottky metal pillars are continuously formed in parallel with the insulated gates, the side wall portions of the Schottky metal pillars are overlapped to one another, as hereinafter described in detail.

Figure 25A:
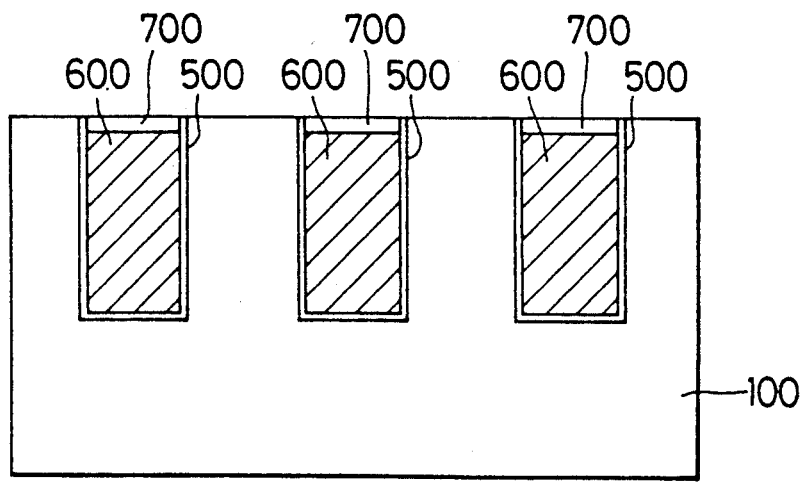
FIGS. 25a to 25c are cross sectional views showing a method for producing the semiconductor device shown in FIG. 24.

In this embodiment, the Schottky tunnel transistor shown in FIG. 24 is produced in the similar manner to the above described embodiments, as shown in FIGS. 22a to 22c. In FIG. 25a, a plurality of stripes of vertical insulated gates comprising gate insulating films 500, gate electrodes 600 and insulating films 700 is formed in the surface of an $n^-$-type silicon semiconductor substrate 100 in the same manner as the seventh embodiment shown in FIG. 22a.

Figure 25B:
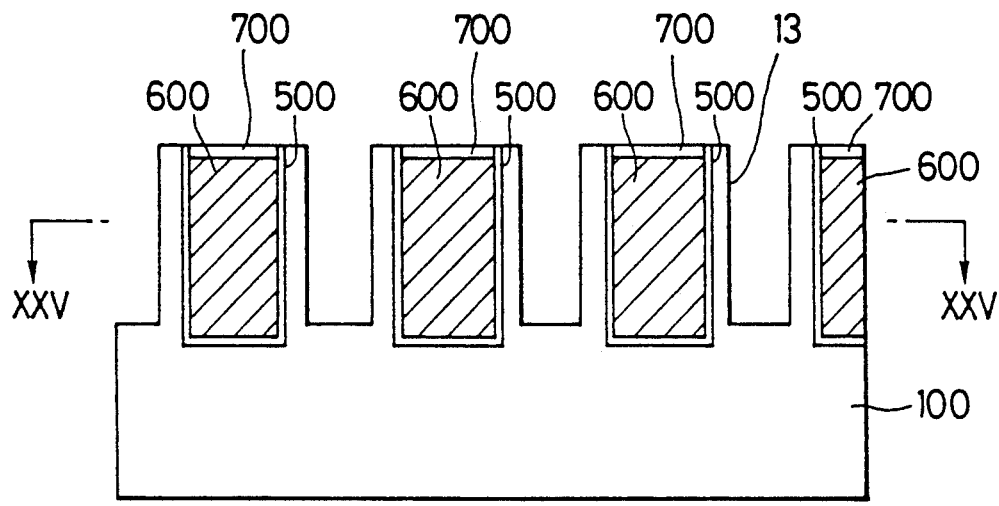
Figure 25C:
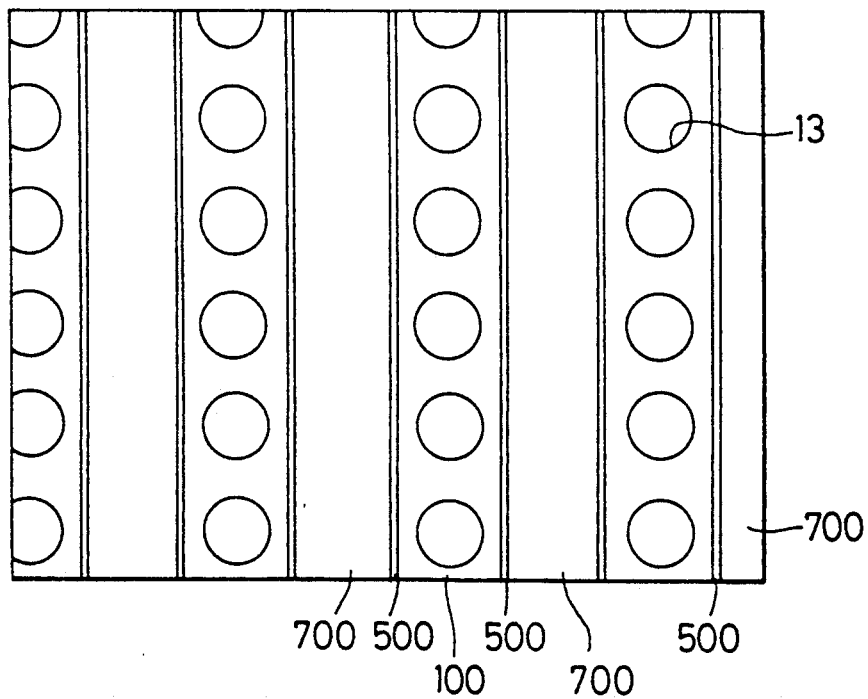

In FIGS. 25b and 25c, by using a photoresist pattern having circular openings aligned in parallel, the surface area of the substrate 100 is etched to form trench holes 13 having a circular cross section between the stripes of the vertical insulated gates in the same manner as the seventh embodiment described above.

Then, the photoresist pattern is removed, and a Schottky metal film 401 is formed on the surface of the substrate 100 to fill in the trench holes 13 and to form the Schottky junctions 301 between the substrate 100 and the Schottky metal film 401 in the same manner as the seventh embodiment. In this case, the growing condition of the Schottky metal deposition in the trench holes 13 is controlled so that the Schottky metal encroaches the substrate 100 around the trench holes 13 during the deposition of the Schottky metal in the trench holes 13 and the deposited Schottky metal in the trench holes 13 contacts the gate insulating films 500. Then, a drain electrode 200 is formed on the back surface of the substrate 100, thereby obtaining the Schottky tunnel transistor shown in FIGS. 24a to 24c.

Figure 26A:
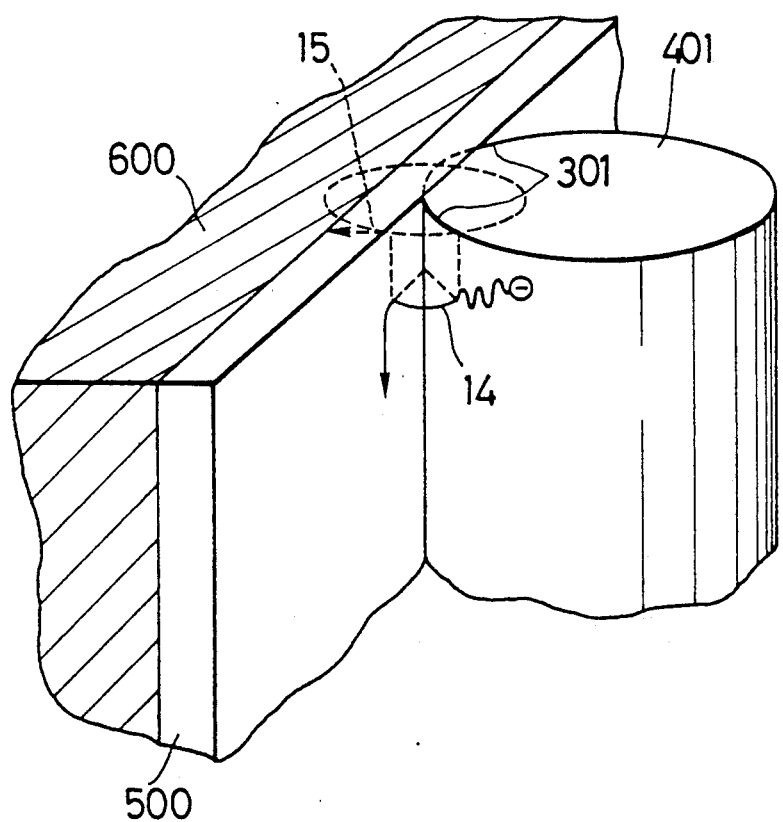
FIGS. 26a to 26c, like FIGS. 24a to 24c, show a channel region of the semiconductor device shown in FIG. 24.

There is shown in FIG. 26a the channel portion of the Schottky junction 301 between the substrate 100 and the Schottky metal 401 in the Schottky tunnel transistor of the eighth embodiment described above, wherein an arrow of a solid line 14 indicates the moving of the electron and an arrow of a broken line 15 shows the electric field from the gate electrode 600 through the gate insulating film 500. The Schottky metal 401 may be separated from the insulated gate when the channel region is positioned within the range where the electric field of the insulated gate affects the tunnel current flowing through the Schottky junction. In such a case, the effective acting distance between the Schottky metal 401 and the insulated gate is approximately several tens of angstroms.

Figure 26B:
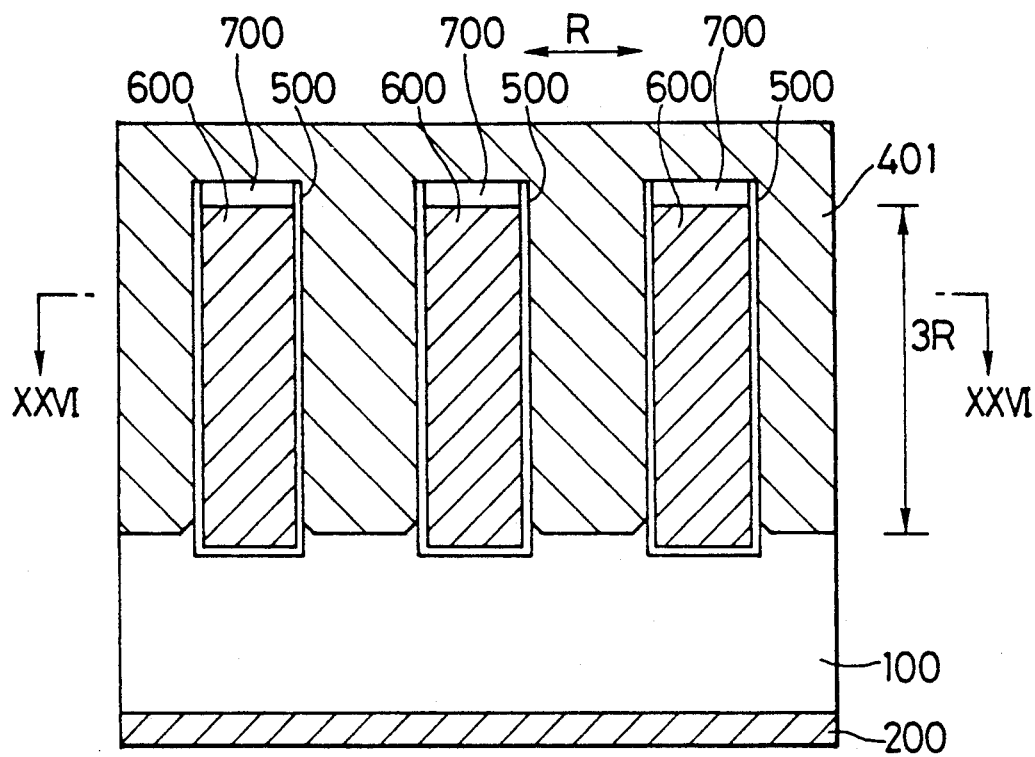
Figure 26C:
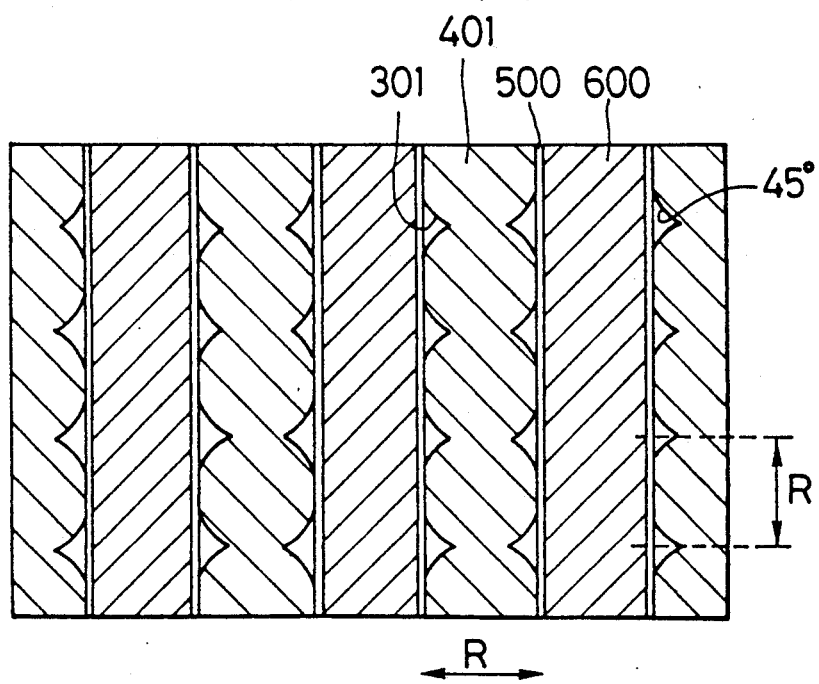

In FIGS. 26b and 26c, there is shown one example of the Schottky tunnel transistor of the eighth embodiment, in which the trench holes having an aspect ratio 3 are formed, and two channel regions, each having a length 3R extending in the direction in depth, are provided every one unit length R of the gate electrode 600. Hence, the width of the channel regions every one unit length R of the gate electrode 600 becomes 6R.

Figure 27A:
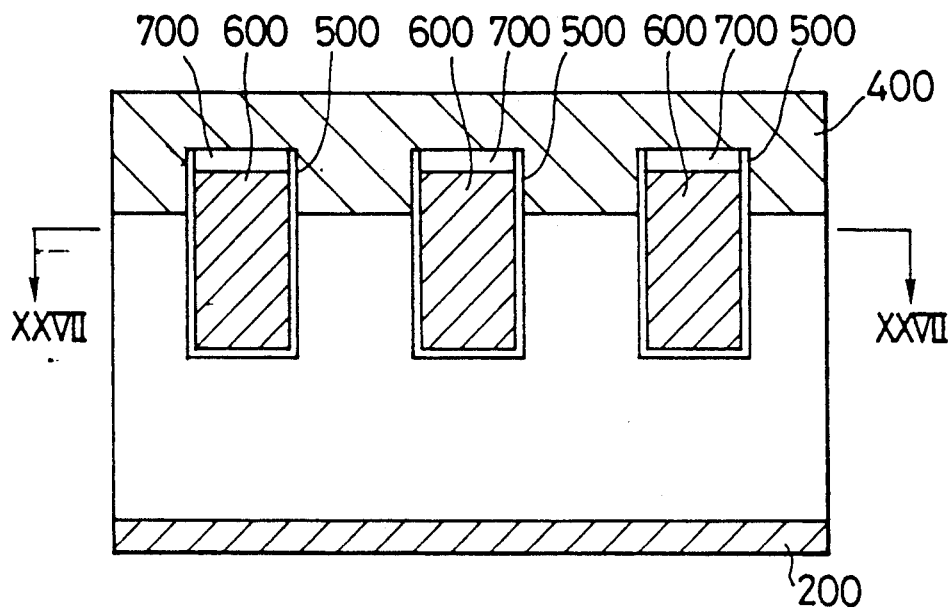
FIGS. 27a to 27c, like FIGS. 21a to 21c, show a comparative embodiment with respect to the eighth embodiment shown in FIG. 24.
Figure 27B:
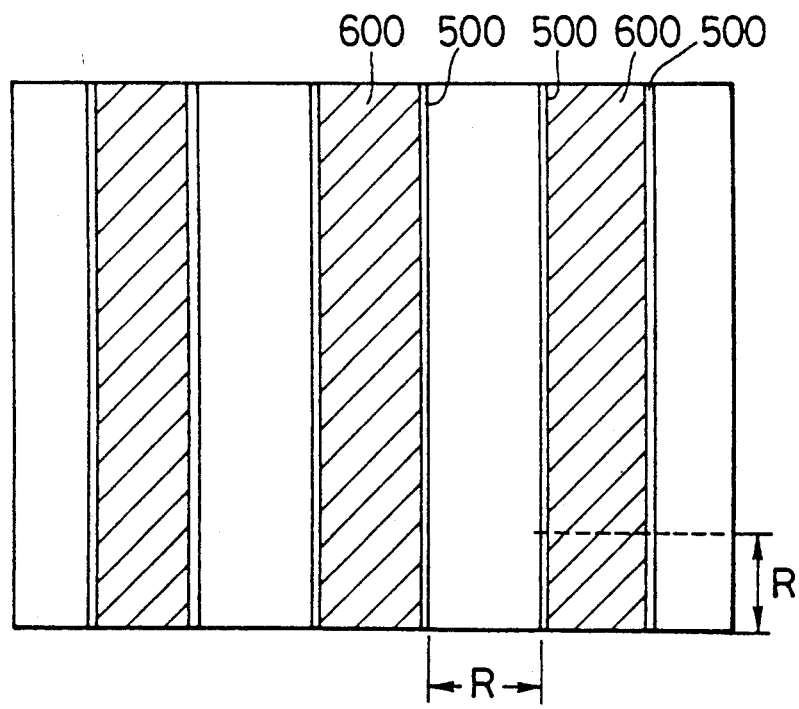
Figure 27C:
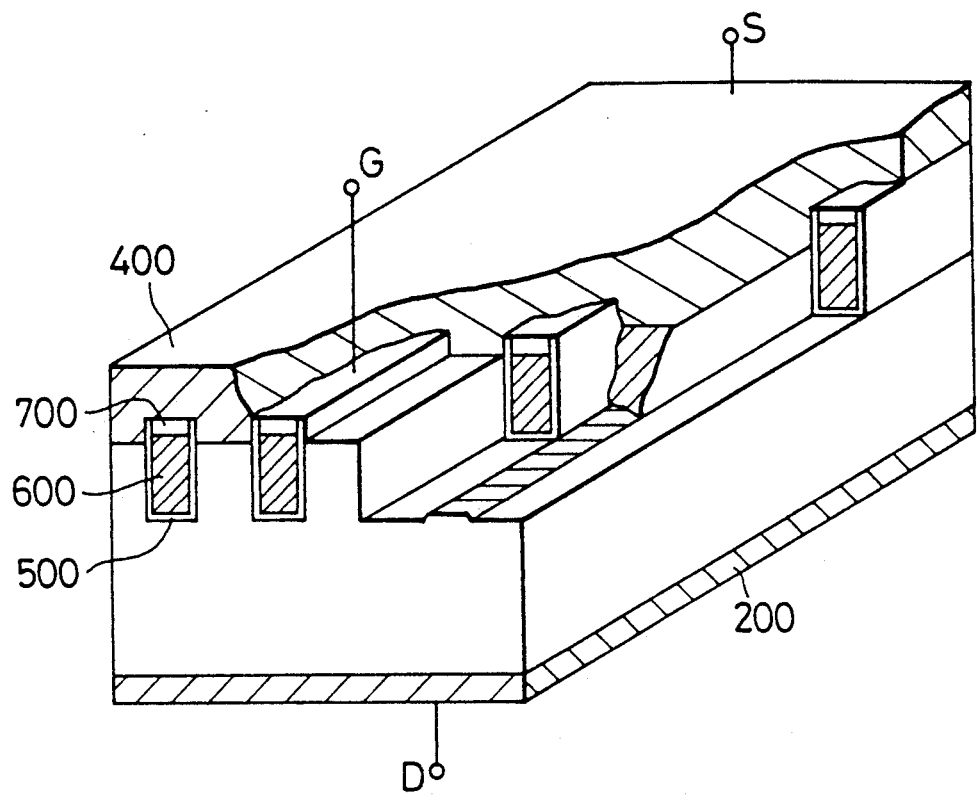

In FIGS. 27a to 27c, there is shown a comparative example of a conventional Schottky tunnel transistor, in which channel regions are formed without using trench holes, and the width of the channel region per one unit length R of the gate electrode 600 is R.

In the eighth embodiment, as clearly shown in FIGS. 24 and 26, the angle formed by the channel region of the Schottky junction 301 and the gate insulating film 500 or the electrode surface of the gate electrode 600 in the substrate 100 becomes an acute angle, and thus the channel region of the Schottky junction 301 can effectively receive the electric field of the gate electrode 600.

In the embodiment shown in FIGS. 26a to 26c, the angle formed by the channel region of the Schottky junction 301 and the gate insulating film 500 or the electrode surface of the gate electrode 600 in the substrate 100 is substantially 45°. The current capacity of the channel region is twice as much as that of the comparative example shown in FIG. 27a, as shown in FIG. 10, and the total current capacity is 12 times as much as that of the comparative example.

Figure 28:
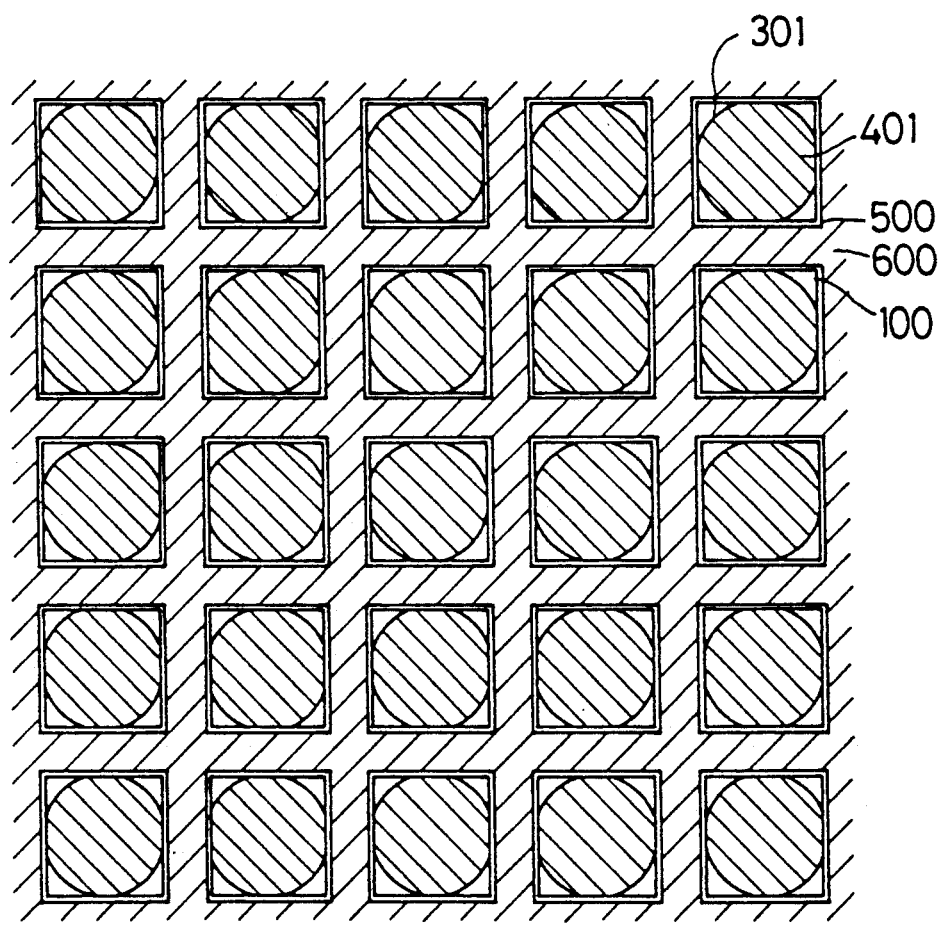
FIGS. 28a to 28c are horizontal cross sections of a ninth embodiment of a semiconductor device according to the present invention.
Figure 28:
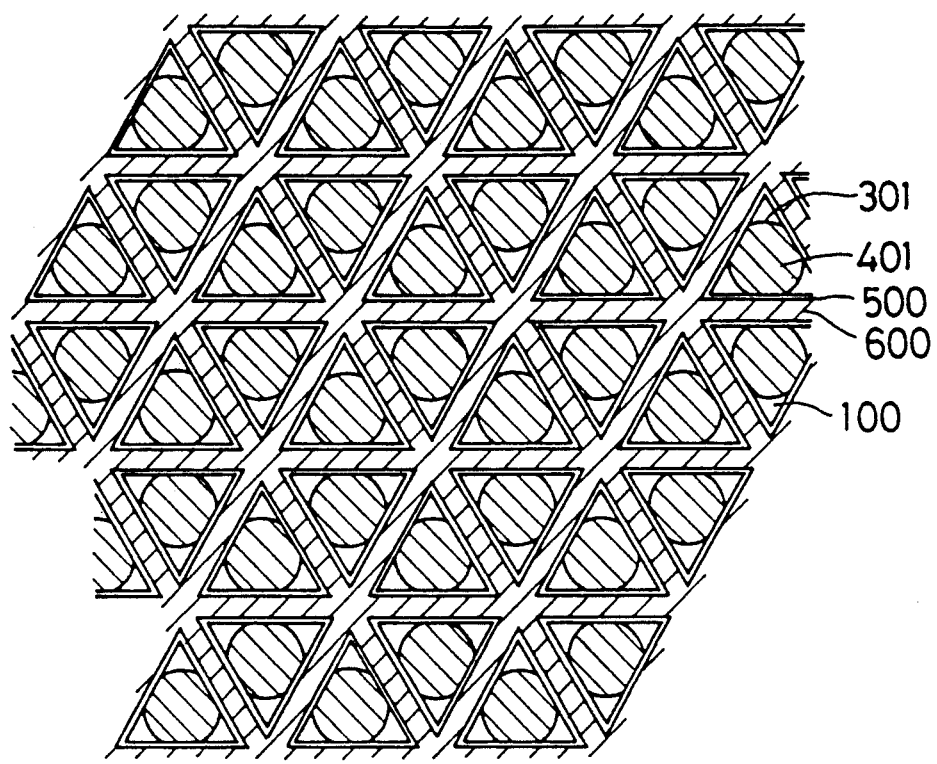
Figure 28:
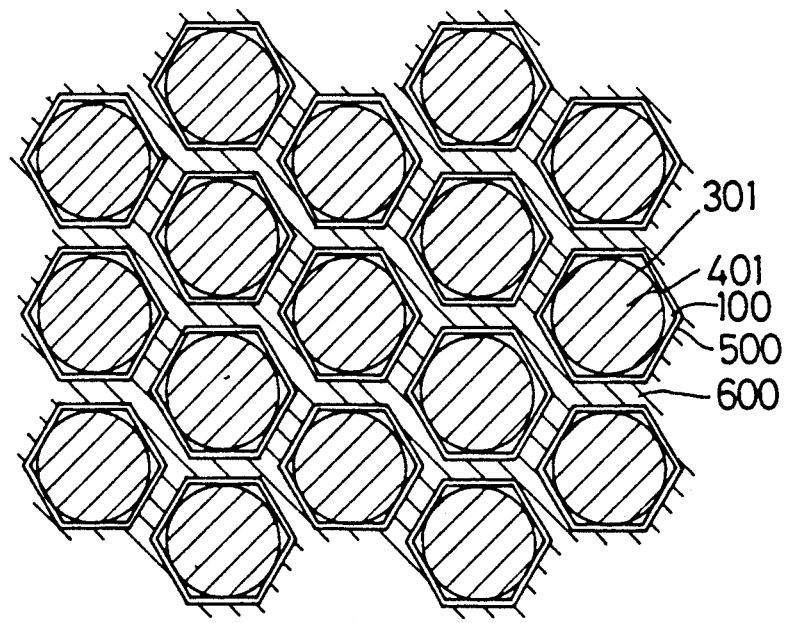

In FIG. 28, there is transversely shown the ninth embodiment of the Schottky tunnel transistor according to the present invention, having a similar structure to those of the seventh and eighth embodiments shown in FIGS. 21 and 24, except that each vertical circular pillar of the Schottky metal 401 is surrounded by regular polygonal, such as triangular, square or hexagonal, gate insulating films 500 in contact therewith in the substrate 100. When the conditions such as the gate width and the like are equal to those of the eighth embodiment, the current amount per one unit area of the one shown in FIG. 28a, FIG. 28b or FIG. 28c is approximately the same, twice or 5 times, respectively, as much as that of the eight embodiment.

Figure 30:
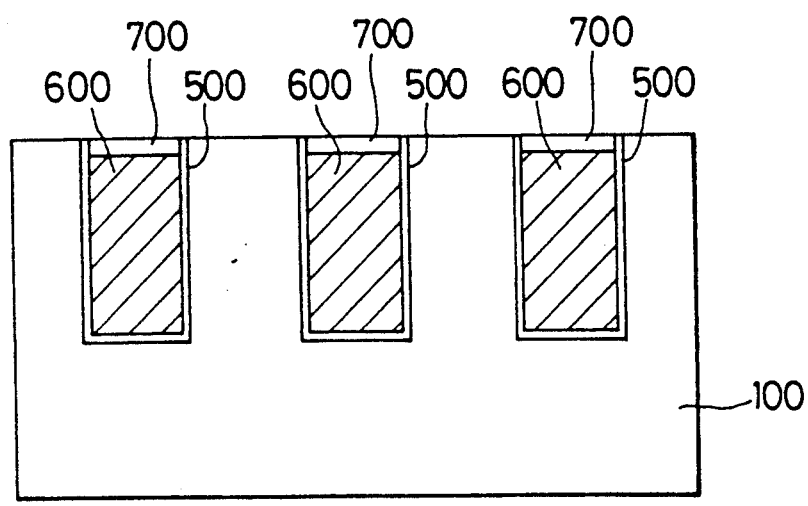
FIGS. 30a to 30c are cross sectional views showing a method for producing the semiconductor device shown in FIG. 29.
Figure 29:
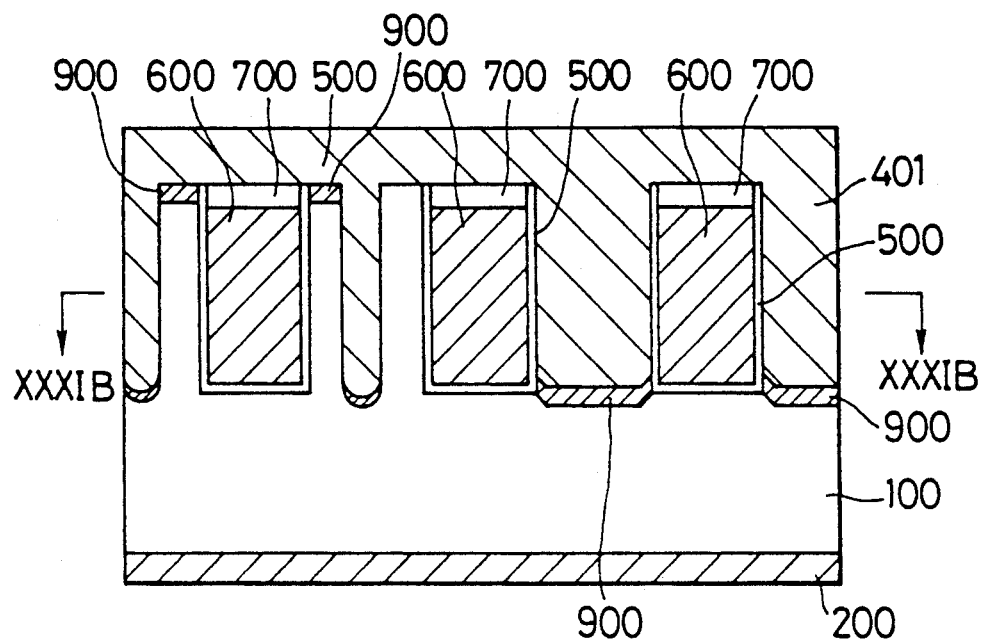
FIGS. 29a and 29b, like FIGS. 24a and 24b, show a tenth embodiment of a semiconductor device according to the present invention.
Figure 29:
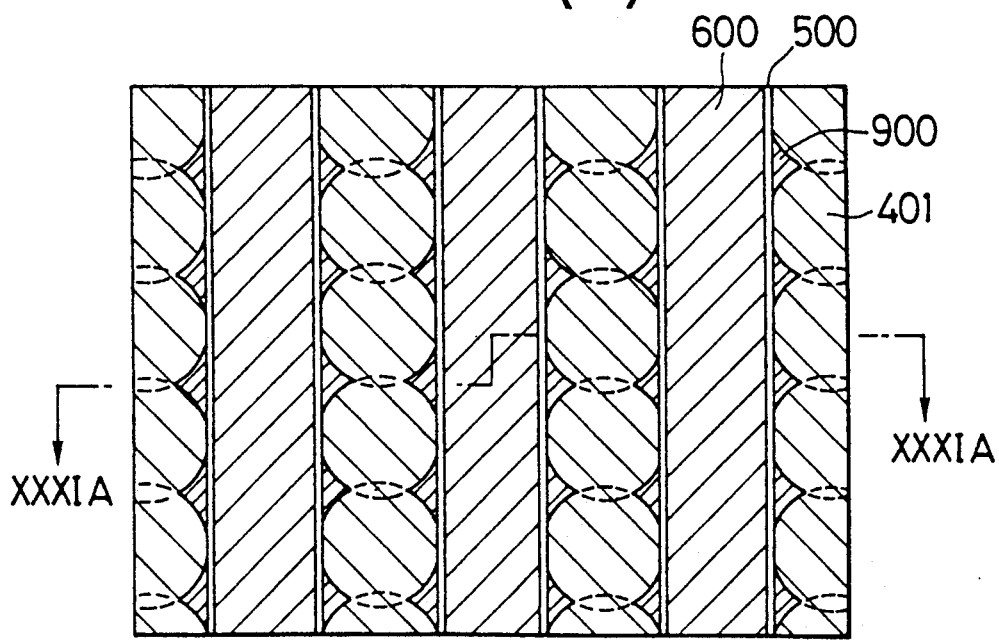
Figure 30:
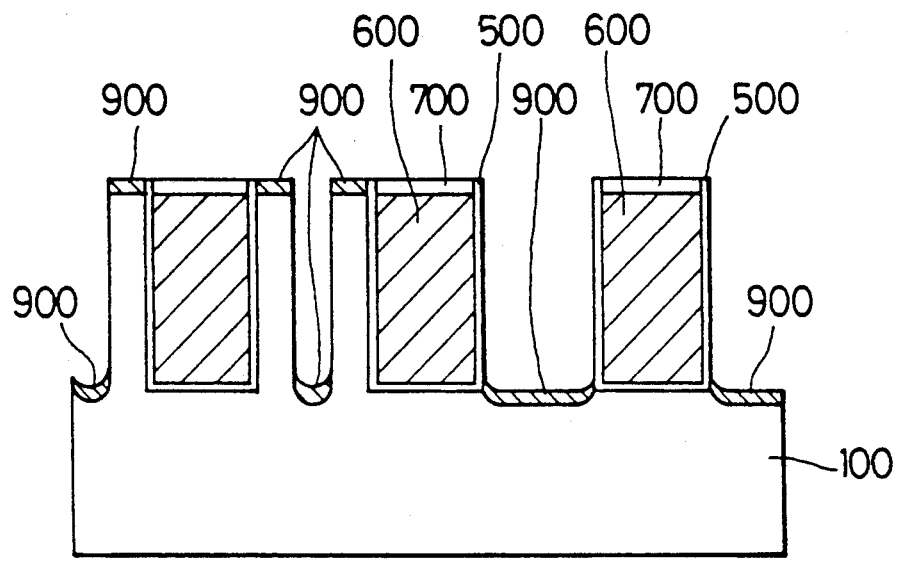
Figure 30:
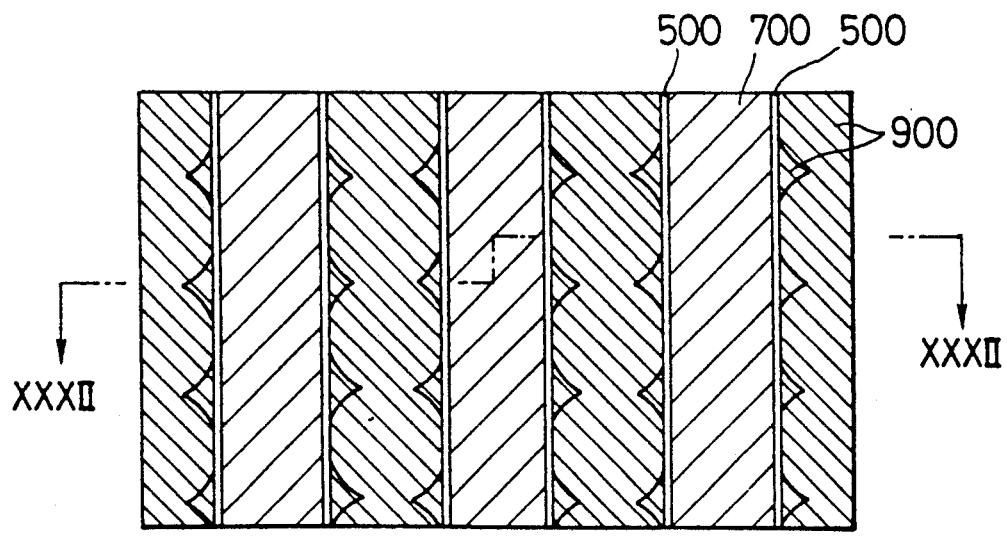

In FIGS. 29 and 30, there is shown the tenth embodiment of the Schottky tunnel transistor according to the present invention, having the same construction as that of the seventh embodiment shown in FIGS. 21 and 22, except that thin shield diffusion layers 900 are formed at the Schottky junctions not constituting the channel regions by doping a p-type impurity. In this embodiment, the device is operated in a similar manner to those of the seventh and ninth embodiments. However, when the device is off, the leak current from the Schottky junctions except their channel regions can be effectively prevented to improve the resisting voltage characteristics.

In this embodiment, the Schottky tunnel transistor shown in FIG. 29 is produced in a manner similar to the above described embodiments, as shown in FIGS. 30a to 30c. In FIG. 30a, a plurality of stripes of vertical insulated gates comprising gate insulating films 500, gate electrodes 600 and insulating films 700 is formed in the surface of an n⁻-type silicon semiconductor substrate 100 in the same manner as in the eighth embodiment described above.

In FIGS. 30b and 30c, by using a photoresist pattern having circular openings aligned in parallel, trench holes are formed in the surface area of the substrate 100 between the stripes of the vertical insulated gates in the same manner as in the eighth embodiment described above. In this case, overetching is effected to form the large trench holes so that the gate insulating films 500 are partially exposed at the side walls of the trench holes. Then, ion implantation of an impurity of the opposite conductivity type to that of the substrate 100 is effected to the surface of the substrate 100, and anncaling is carried out at a relatively low temperature, enough to electrically activate the implanted ions.

Then, the trench holes are filled up with the Schottky metal by gas-phase growing. At this time, the growing condition of the Schottky metal deposition is controlled so as not to encroach the ion implanted region of the opposite conductivity type to that of the substrate 100.

In this embodiment, the leak current from the PN junction composed of the shield diffusion layer 900 and the n⁻-type silicon semiconductor substrate 100 is less than that from the Schottky junction, and hence the Schottky junctions except the channel regions are changed to such a PN junction as described above to largely reduce the leak current during the off state of the device.

In the above described embodiments of the present invention, the Schottky junctions are replaced with a superabrupt junction composed of an extremely high concentrated impurity p-type region and an n-type region to control the tunnel phenomenon from the filled up area to the conductive area by the electric field of the insulated gates, resulting in a semiconductor device having the same function as that of the other embodiments.

What is claimed is:

1. A semiconductor device, comprising:
   a semiconductor substrate serving as a drain region and having a first surface;
   a metal source region formed on said first surface of said substrate, said metal and said substrate constituting a Schottky junction; and
   an insulated gate which includes a gate electrode and an insulating film surrounding said gate electrode adjacent to said Schottky junction,
   wherein an angle formed by said Schottky junction and said insulated gate in said substrate is an acute angle.

2. A semiconductor device, comprising:
   a first conductivity type semiconductor substrate serving as a drain region and having a first surface;
   a metal source region formed on said first surface of said substrate, said metal and said substrate constituting a Schottky junction, a part of said metal being buried in said substrate in the form of a buried metal pillar;
   an insulated gate which includes a gate electrode and an insulating film surrounding said gate electrode adjacent to said buried metal pillar; and
   a channel region as part of said Schottky junction where a tunnel current is caused to flow by said insulated gate, said channel region being formed at least in a depth direction of said substrate.

3. The device of claim 2, wherein an angle formed by said channel region and said insulated gate in said substrate is an acute angle.

4. The device of claim 2, wherein said buried metal pillar has a rectangular transverse cross section.

5. The device of claim 2, wherein said buried metal pillar has a circular transverse cross section.

6. The device of claim 2, wherein said device further includes a shield layer of a second conductivity type between said metal source region and said substrate except in said channel region.

* * * * *